United States Patent
Edwards et al.

(10) Patent No.: US 10,997,782 B2
(45) Date of Patent: May 4, 2021

(54) ASSOCIATING A POINT CLOUD IMAGE WITH A PIPING LINE DRAWING AND APPLYING DIMENSIONS REGARDING THE SAME

(71) Applicant: Intergraph Corporation, Madison, AL (US)

(72) Inventors: James Edwards, Runcorn (GB); David Myall, Runcorn (GB)

(73) Assignee: Intergraph Corporation, Madison, AL (US)

( * ) Notice: Subject to any disclaimer, the term of this patent is extended or adjusted under 35 U.S.C. 154(b) by 1602 days.

(21) Appl. No.: 14/158,204

(22) Filed: Jan. 17, 2014

(65) Prior Publication Data

US 2014/0207420 A1    Jul. 24, 2014

Related U.S. Application Data

(60) Provisional application No. 61/754,199, filed on Jan. 18, 2013.

(51) Int. Cl.
  *G06T 17/00* (2006.01)
  *G06T 19/00* (2011.01)
  *G06F 30/20* (2020.01)

(52) U.S. Cl.
  CPC .............. *G06T 17/00* (2013.01); *G06T 19/00* (2013.01); *G06F 30/20* (2020.01); *G06T 2210/56* (2013.01); *G06T 2219/012* (2013.01); *G06T 2219/028* (2013.01)

(58) Field of Classification Search
  CPC ... G06T 17/00; G06T 19/00; G06T 2219/028; G06T 2210/56; G06F 17/50; G06F 30/00
  See application file for complete search history.

(56) References Cited

U.S. PATENT DOCUMENTS

| 2008/0215256 A1* | 9/2008 | Hill | F17D 5/00 |
| | | | 702/36 |
| 2012/0116728 A1* | 5/2012 | Shear | G06F 17/50 |
| | | | 703/1 |

FOREIGN PATENT DOCUMENTS

| CN | 102495879 | 6/2012 |
| JP | 2008-102741 | 5/2008 |
| JP | 2011-528829 | 11/2011 |
| JP | 2012-88778 | 5/2012 |

(Continued)

OTHER PUBLICATIONS

Leica, CloudWorx for Integraph SmartPlant Review 1.0 Tutorial, Feb. 2006, Leica Geosystems HDS, pp. 1-21.*

(Continued)

*Primary Examiner* — Omar F Fernandez Rivas
*Assistant Examiner* — Bernard E Cothran
(74) *Attorney, Agent, or Firm* — Nutter McClennen & Fish LLP

(57) ABSTRACT

A method for creating a line drawing associated with a point cloud provides a line drawing representing a three-dimensional object and a point cloud of the same. The line drawing has line drawing coordinate data, and the point cloud has point cloud coordinate data. The point cloud also has point cloud distance data of the three-dimensional object. The method also associates the line drawing coordinate data with the point cloud coordinate data. Further, the method uses the associated coordinate data to apply the point cloud distance data to the line drawing.

21 Claims, 18 Drawing Sheets

(56) References Cited

FOREIGN PATENT DOCUMENTS

KR  1999-0068619  9/1999
WO  WO 97/40342  10/1997

OTHER PUBLICATIONS

BusinessDictionary.com, as-built drawings, 2017, BusinessDictionary.com, p. 1.*
Bender, Gas Accumulation Application using CSA Laser Scanning and 3D Technology, Aug. 2012, Construction Systems Associates, Inc., pp. 1-8 (Year: 2012).*
SF Design, Isometric for Pipeline Manufacturing, Mar. 2010, SF Design, pp. 1-8 (Year: 2010).*
Solken, Coordination System Piping Arrangement, 2010, Werner Solken, pp. 1-9 (Year: 2010).*
Green, Process plant design using Medusa, Apr. 1987, Computer-Aided Engineering Journal, pp. 89-93 (Year: 1987).*
Danko, David, "Beyond Scanning", *Hydrocarbon Engineering*, http://falk-pli.com/pdf/beyond-scanning-0707.pdf, Jul. 2007, accessed May 8, 2014, 4 pages.
Leica Geosystems, "Leica CloudWorx 4.0 for MicroStation", http://www.nsscanada.com/Images/Downloadable20Papers/Brochure/Leica%20Cloudworx%20Software.pdf, 2010, accessed May 14, 2014, 6 pages.
Shih, Naai-Jung, et al, "Plumbing Locator in an As-Built Building Form", 20th Annual Association of Researchers in Construction Management (ARCOM) Conference, vol. 1, 2004, pp. 267-275, 9 pages.
Sternberg, H., et al, "Terrestrial 3D Laser Scanning—Data Acquisition and Object Modelling for Industrial As-Built Documentation and Architectural Applications", International Society for Photogrammetry and Remote Sensing (ISPRS), Jan. 2004, http://www.isprs.org/proceedings/XXXV/congressjcomm5/papers/183.pdf, accessed May 14, 2014, 6 pages.
European Patent Office, International Search Report and Written Opinion for PCT/US2014/012027, dated May 22, 2014, 12 pages.
Korean Intellectual Property Office, Examination Report for Korean Application No. 10-2015-7019344, dated Mar. 22, 2016, 7 pages.
English translation of Examination Report for Korean Application No. 10-2015-7019344, dated Mar. 22, 2016, 10 pages.
Shih, et al., "Using Point Cloud With GIS and Virtual Reality to Manage and Inspect Building Plumbing," *40th Annual Conference of the Architectural Science Association*, pp. 174-179, Nov. 2006.
Canadian Intellectual Property Office, Office Action Notice, Canadian Application No. 2,893,616, 3 pages, dated May 1, 2017.
State Intellectual Property of China, First Office Action, Chinese Application No. 201480003592.0, 6 pages, dated Sep. 1, 2016.
State Intellectual Property of China, Search Report, Chinese Application No. 201480003592.0, 3 pages, dated Sep. 1, 2016.

* cited by examiner

ASSOCIATING A POINT CLOUD IMAGE WITH A PIPING LINE DRAWING AND APPLYING DIMENSIONS REGARDING THE SAME

RELATED APPLICATION

This application claims priority to U.S. Application No. 61/754,199, entitled "Associating a Point Cloud Image With a Piping Line Drawing and Applying Dimensions Regarding the Same" and filed on Jan. 18, 2013, the contents of which is hereby incorporated by reference in its entirety.

TECHNICAL FIELD

The disclosure is directed generally to creating piping isometric line drawings from point clouds. More specifically, the disclosure is directed to using point clouds to accurately represent objects in piping isometric line drawings.

BACKGROUND ART

Large facilities often have complicated infrastructure, including machines, piping, valves, and electrical wiring. During a facility's lifecycle, the infrastructure will need to be adjusted, updated, and/or overhauled. Having an up-to-date blueprint of the existing infrastructure facilitates planning for the changes to be made.

In the past, personnel have measured dimensions of the infrastructure's components by hand and drawn blueprints according to the measurements. In some cases, the blueprints have been kept on-site at the facility, where they may be lost or damaged. Further, due to working conditions at the facilities, components may expand or otherwise becoming distorted. The changes to components' dimensions and locations render prior blueprints inaccurate and obsolete.

Personnel have also attempted to use point cloud images to create schematics of the facilities. However, point cloud images are limited because for any given image, parts of components or entire components may be obscured. Further, schematics derived from point cloud images merely duplicate the outlines of the components in the images.

SUMMARY OF THE EMBODIMENTS

In accordance with one embodiment of the invention, a method creates a piping line drawing associated with a point cloud. To that end, the method provides a piping line drawing representing a three-dimensional object and a point cloud of the same. The piping line drawing has line drawing coordinate data, and the point cloud has point cloud coordinate data. The point cloud also has point cloud distance data of the three-dimensional object. The method also associates the line drawing coordinate data with the point cloud coordinate data. Further, the method uses the associated coordinate data to apply the point cloud distance data to the piping line drawing.

Among other ways, the method provides the piping line drawing by receiving inputs from a user corresponding to the piping line drawing and displaying the piping line drawing in a user interface. The method provides the point cloud by displaying the point cloud in the user interface. The method may display the piping line drawing and the point cloud in the same user interface. In some embodiments, the method displays the piping line drawing in a first window of the user interface while displaying the point cloud in a second window of the user interface.

In some embodiments, the method determines a distance between two locations on the point cloud. The method also applies the distance to a component positioned between two locations on the piping line drawing that correspond to the two locations on the point cloud. In some embodiments, the method receives a user selection of a first location on the piping line drawing and receives a user selection of a first location on the point cloud. The method associates coordinate data of the first location on the piping line drawing with coordinate data of the first location on the point cloud. In some embodiments, the method determines an axis of a component associated with the first location on the point cloud and constrains user selection of a second location on the point cloud to locations on the axis. In some embodiments, the method receives a user selection of a second location on the piping line drawing, receives a user selection of a second location on the point cloud, and associates coordinate data of the second location on the piping line drawing with coordinate data of the second location on the point cloud.

In some embodiments, the method determines a distance between the first location and the second location on the point cloud. The method applies the distance to a component positioned between the first location and the second location on the piping line drawing. When a user updates the second location on the point cloud, the method updates the distance between the first location and the second location on the point cloud. The method applies the updated distance to the component positioned between the first location and the second location on the piping line drawing. In some embodiments, the method applies the distance when the method receives a user input to apply a distance between locations on the point cloud to a length of a component in the piping line drawing.

In some embodiments, the method overlays a scaled representation of the piping line drawing on the point cloud. The method receives an input to change a dimension of a component in the piping line drawing. The method adjusts the scaled representation of the piping line drawing based on the input.

In some embodiments, the point cloud depicts at least one of pipes and valves.

In some embodiments, the method creates a piping isometric drawing from the piping line drawing.

In various embodiments, an apparatus with at least one processor and at least one memory is encoded with instructions. Execution of the instructions by the at least one processor causes the at least one processor to perform any of the steps described above. Further, a computer program product includes a non-transitory computer-readable medium having computer code thereon for recommending a business for investment. The computer code includes program code for performing any of the steps described above.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In general overview, illustrative embodiments of the invention allow users to create accurate piping line drawings based on components depicted in a point cloud image. Once users complete the piping line drawings, then various embodiments allow users to produce piping isometric drawings derived from the piping line drawings. To that end, a user can retrieve a point cloud for display. Using the configuration of components in the point cloud as a template, the user can arrange symbols corresponding to fittings and lines corresponding to lengths of pipe to create a piping line drawing. Further, the user can select locations in the piping line drawing and associate them with selected locations in the point cloud, thereby associating the coordinates of the associated locations. Since the point cloud includes data about the positions of components depicted in its captured scene, embodiments of the invention can determine the distance between selected locations in the point cloud. The user can transfer these distance measurements between selected locations in the point cloud to the corresponding selected, associated locations in the piping line drawing. This enables the user to convert the completed piping line drawing to a piping isometric drawing. Details are discussed below.

Figure 1:
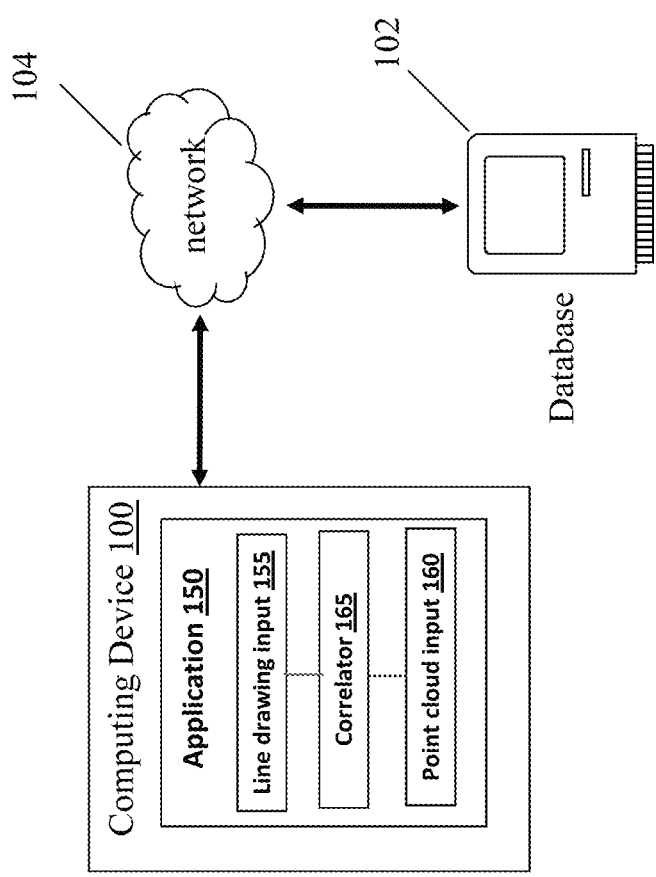
FIG. 1 schematically depicts an exemplary computing environment in which the application described herein is executed.

FIG. 1 shows an exemplary computing environment in which the application described herein may be executed in accordance with illustrative embodiments. Specifically, the environment includes a computing device 100 that executes an application 150 performing various of the operations described herein via, for example, a line drawing input 155, a point cloud input 160, and a correlator 165. In some embodiments, the computing device 100 communicates over a network 104 with a database 102 that stores point clouds. For example, the point clouds may include representations of pipes in a large structure, such as a power plant. The computing device 100 retrieves point clouds selected by a user from the database 102. In other embodiments, the computing device 100 stores the point clouds in a local memory. In further embodiments, the computing device 100 stores some point clouds locally and can access point clouds in the database 102.

Figure 2:
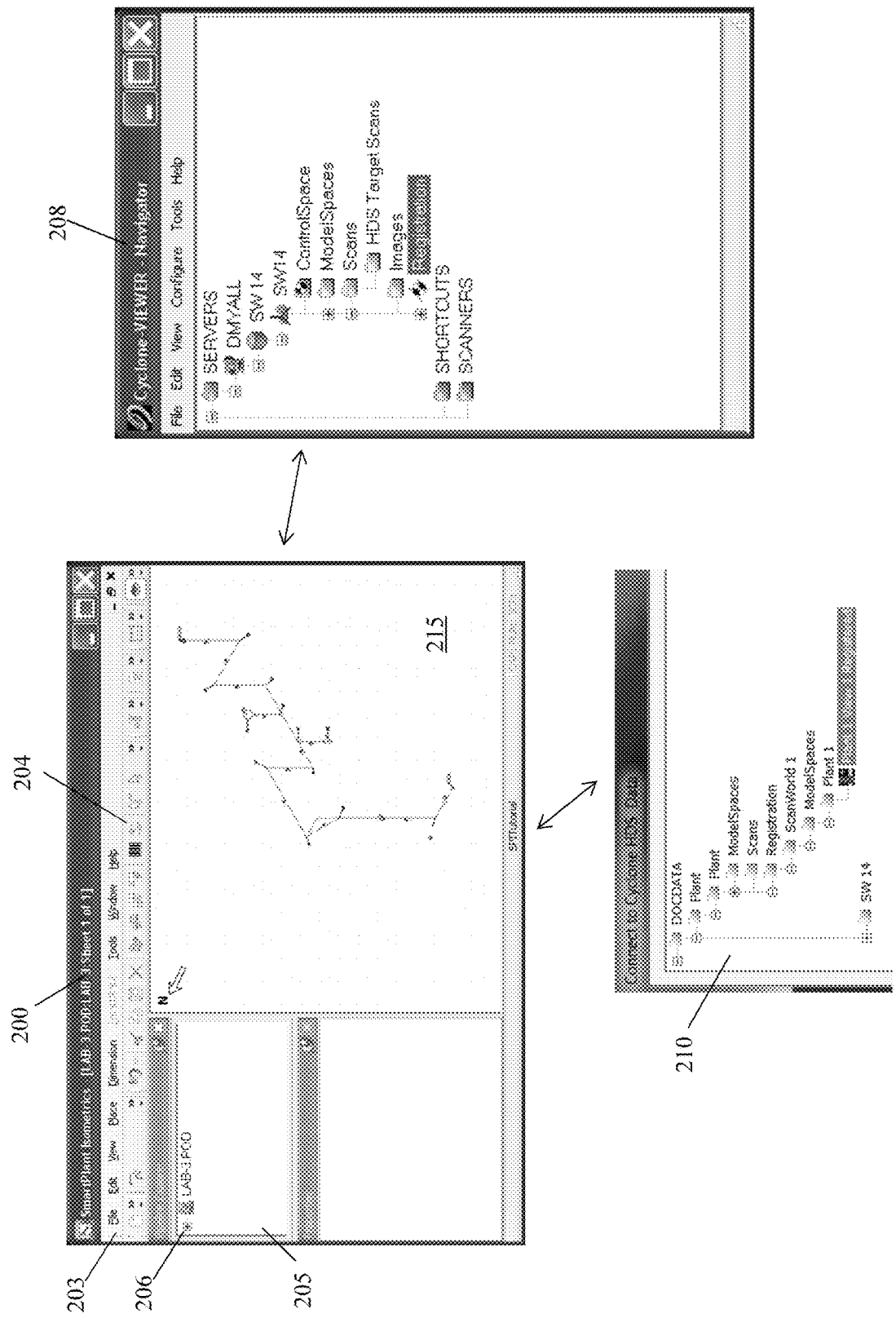
FIG. 2 schematically depicts an exemplary user interface of the application, including two exemplary windows used for loading point clouds.

FIG. 2 shows an exemplary user interface 200, including two exemplary windows 205, 210 used for selecting point clouds or piping line drawings to display. A user may use this interface 200 to access point clouds for which the user intends to create corresponding piping line drawings, or existing piping line drawings that the user wishes to edit. In operation, when the user opens the application 150, the device 100 displays the user interface 200, which includes a menu 203, a toolbar 204, and a file directory window 205. In some embodiments, the file directory window 205 displays the directories that are storing point clouds and/or piping line drawings. The user may select a control, such as control 206, to expand directories and thus display their files. In further embodiments, a user may select the file option from the menu 203. In response, the application 150 may display windows such as windows 208 and 210. From the menu 203, the user accesses point clouds and/or piping line drawings to load into the application 150. Windows 205 and 210 depict exemplary file directories that store point clouds and/or piping line drawings. A user navigates through the directories to one or more point clouds and/or piping line drawings of interest and selects a file. The device 100 displays the selected point cloud or piping line drawing in the display window 215, and the user may begin taking measurements in the point cloud or editing the piping line drawing.

Figure 3:
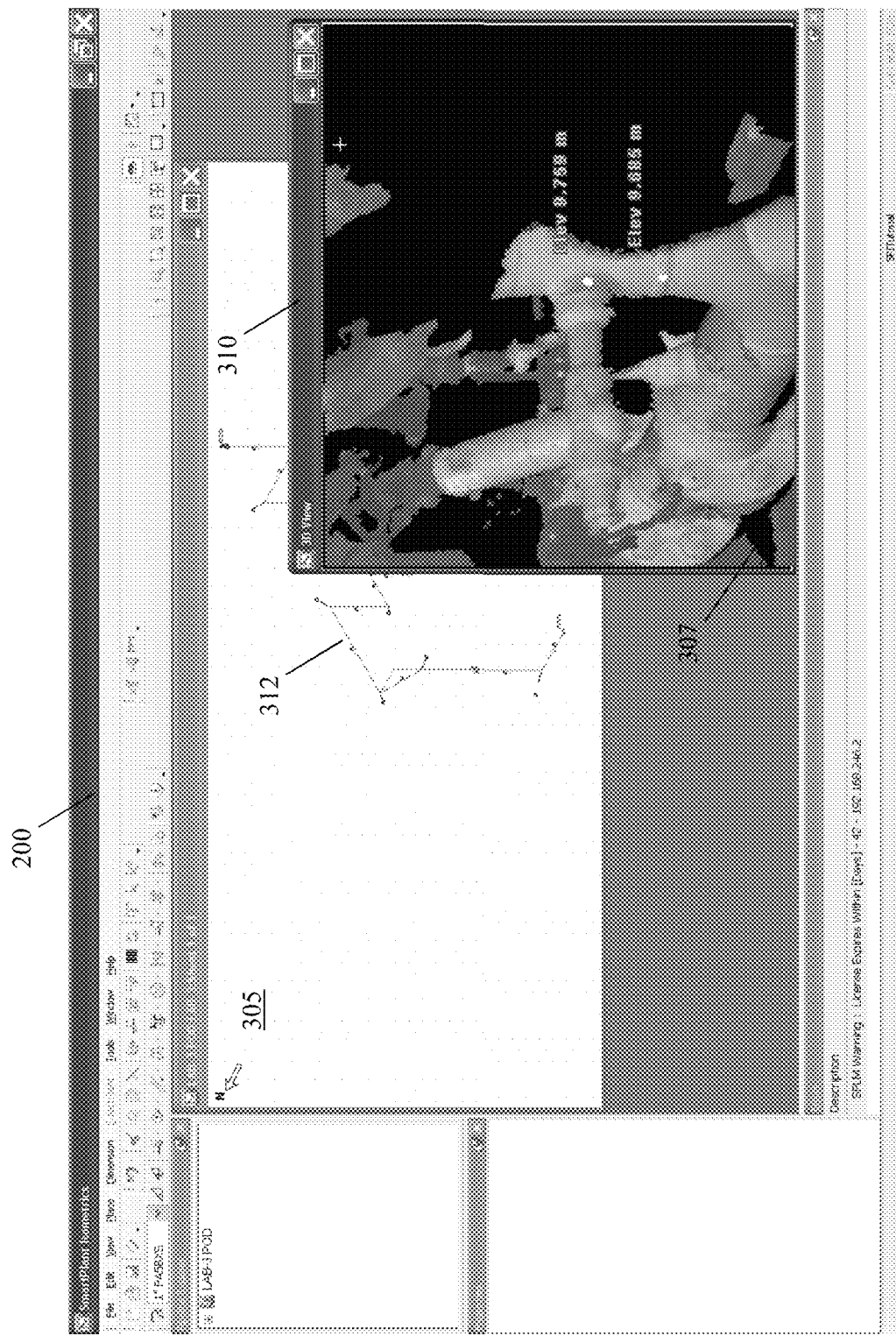
FIG. 3 schematically depicts an exemplary user interface that displays drafting board and a point cloud.

FIG. 3 shows an exemplary user interface with windows for displaying a point cloud alongside its corresponding piping line drawing (e.g., an exemplary workspace for a user). In some embodiments, when the user opens the application 150, the user interface 200 displays a window 305 with a drafting board. When the user selects a file having a point cloud, the user interface 200 displays the point cloud 307 in another window 310. In some embodiments, the windows 305, 310 are displayed in the same user interface 200. If the point cloud 307 has a corresponding piping line drawing 312, the piping line drawing 312 may be displayed in the window 305 with the drafting board. The user may continue editing the piping line drawing 312 based on components displayed in the point cloud 307, as well as take measurements of distances between the components depicted in the point cloud.

The point cloud includes image data (e.g., a set of pixels) and coordinate data for the image data (e.g., coordinates for each pixel). In some embodiments, the relationships between pixel coordinates correspond to the relative positions of locations in the scene (e.g., the distances between locations) that the point cloud captured. In some embodiments, the point cloud embeds information about the scale of the components that it depicts. In other embodiments, the point cloud superimposes a three-dimensional coordinate system upon the depicted scene. The point cloud may include both a superimposed coordinate system and a scale associated with the coordinate system.

Figure 4:
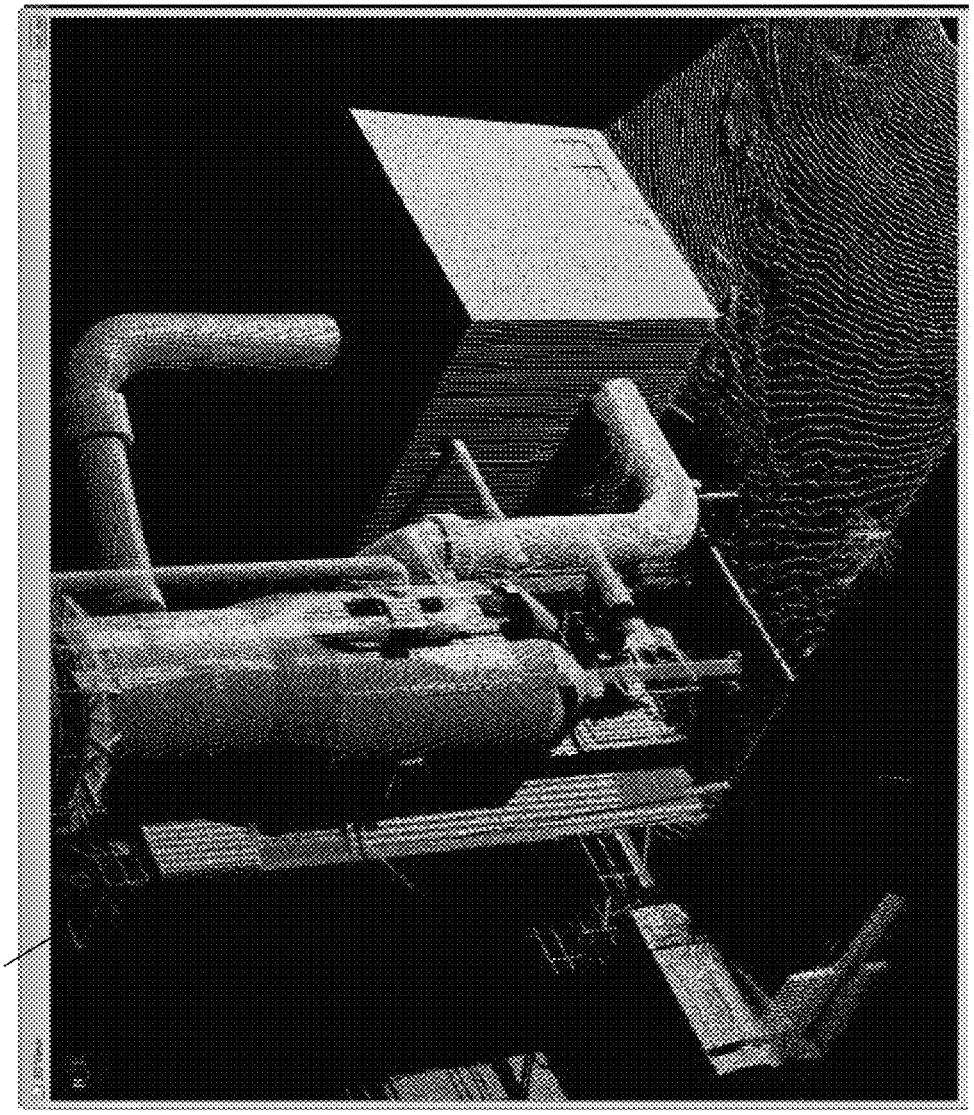
FIG. 4 schematically depicts an exemplary point cloud.

An exemplary point cloud 400 captured at a scene is depicted in FIG. 4. In this particular point cloud 400, the point cloud 400 includes both components and piping that connects the components. In some embodiments, the user interface 200 includes user controls in the toolbar 204 to change the view of the point cloud 400. For example, in response to one of the user controls, the application 150 may display the point cloud in an orthographic view. In response to a different user control, the application 150 may display the point cloud in a perspective view. The user controls may allow the user to rotate the view of the point cloud along one or more axes. In some embodiments, various user controls may revert the view to a default view or an original view (e.g., perspective view).

Figure 5:
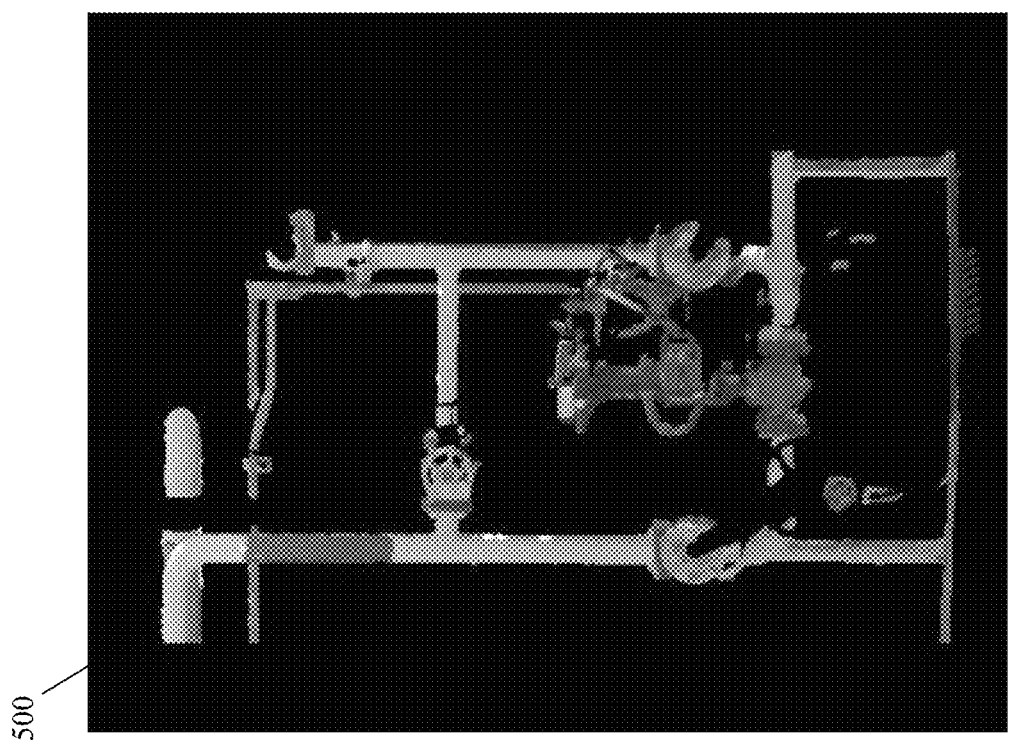
FIG. 5 schematically depicts an exemplary portion of a point cloud, wherein the portion is created by cropping a point cloud to focus on desired components therein.

In some embodiments, the application 150 allows a user to select a portion of a point cloud. Specifically, FIG. 5 shows an exemplary portion 500 of a point cloud, where the portion is created by cropping a larger point cloud to focus on desired components. Among other ways, the user may position a box around the portion of interest. Once the user selects a "crop" option from the menu 203 or toolbar 204, the user interface 200 only displays the portion inside the box. In this manner, the user may focus on the portion of the point cloud that contains components of interest, and create a piping line drawing based solely on these components.

Figure 6:
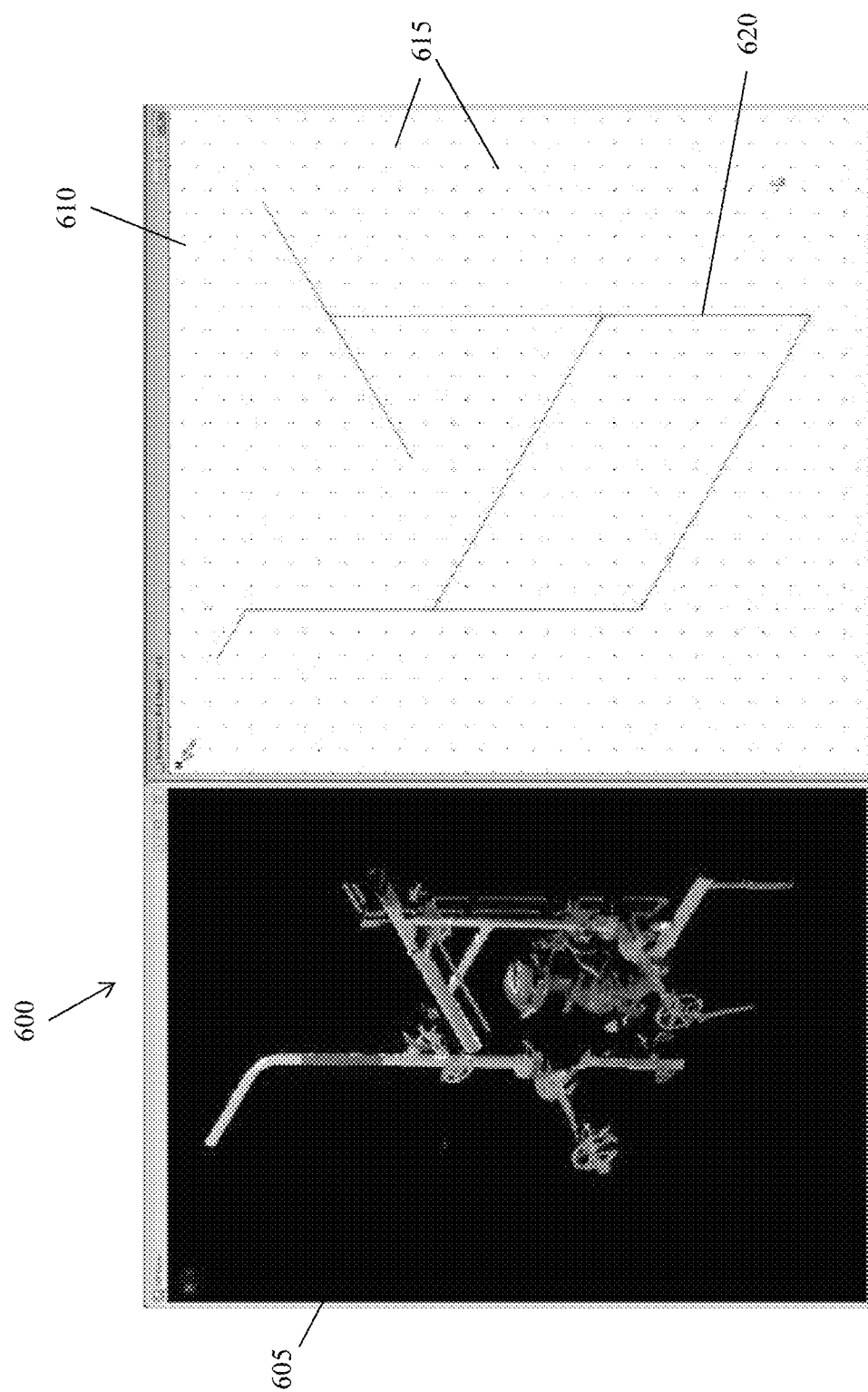
FIG. 6 schematically depicts an exemplary user interface in which a user has created a piping line drawing corresponding to pipes in a point cloud.

Some embodiments show both the line drawing and point cloud in the same display, thus enabling another manner of side-by-side comparison of the point cloud and the corresponding piping line drawing created to depict the components in the point cloud. For example, FIG. 6 shows a user interface 600 in which a user has begun creating a piping line drawing corresponding to pipes in a point cloud. Specifically, the user interface 600 of this embodiment displays the point cloud in a window 605 (left side), and the piping line drawing in a drafting board window 610 (right side).

The drafting board window 610 is a platform on which the user creates piping line drawings that represent three-dimensional scenes. In some embodiments, the drafting board window 610 includes guides 615 indicative of a three-dimensional image space. For example, the drafting board window 610 may include a matrix of dots 615 indicative of the X-, Y-, and Z-axes of an image space. Each location on the drafting board window 610 can include coordinate data. Although the drafting board window 610 is used to create piping line drawings representing three-dimensional scenes, the window 610 itself does not contemplate measurements in three dimensions. Therefore, coordinate data for locations in the window 610 are for two dimensions, i.e., an X- and Y-axis.

In a corresponding manner, the toolbar 204 of the user interface 200 may have tools for drawing lines on the drafting board window 610. In accordance with illustrative embodiments of the invention, a user can create a piping line drawing 620 on the drafting board window 610 that is derived from the concurrently displayed point cloud 605. For example, the user may first adjust the view of the point cloud to orient piping in the point cloud according to the guides 615 in the drafting board window 610. In this manner, the user may align X-, Y-, and Z-axes in the point cloud 605 with the X-, Y-, and Z-axes of the drafting board window's 610 image space. Using the point cloud 605 as a reference, the user may create a piping line drawing 620 corresponding to the arrangement of pipes in the point cloud 605.

Figure 7:
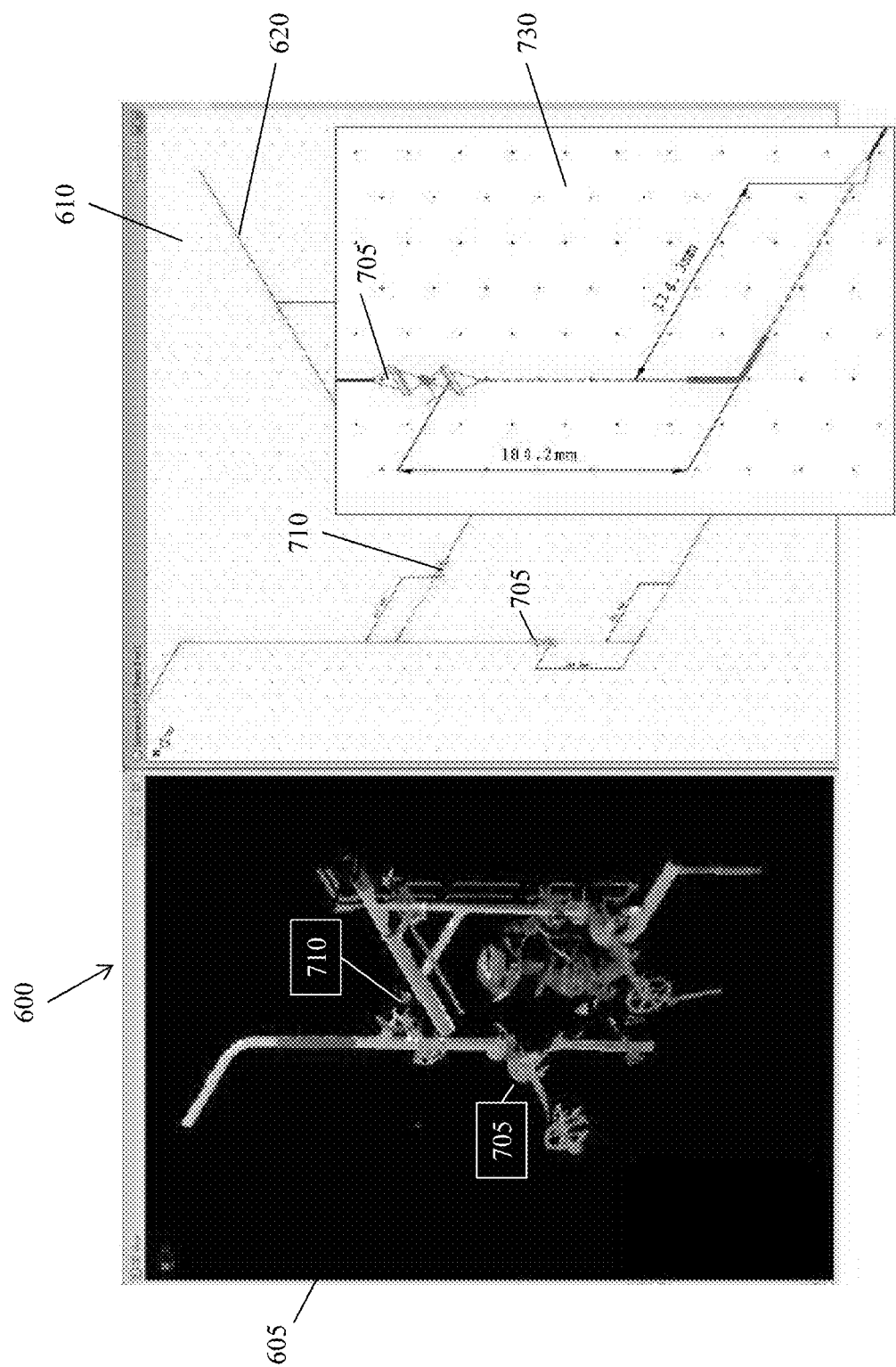
FIG. 7 schematically depicts an exemplary user interface in which a user has created a piping line drawing corresponding to pipes and fittings in a point cloud.

Since point clouds depict fittings and pipes, the user must be able to insert both symbols corresponding to fittings and lines corresponding to pipes in the piping line drawing. FIG. 7 shows an exemplary user interface 600 in which a user has created a piping line drawing 620 accounting for pipes and fittings 705, 710 in a point cloud 605. To that end, the toolbar 204 of the user interface 200 includes tools for inserting components, such as fittings, into the piping line drawing 620 within the drafting board window 610. In some embodiments, the application 150 includes a database of components (not shown) common in an industrial sector. For example, the database may store symbols and/or specifications for various types of fittings, such as valves, flanges, welds, elbows, tees, or other type of components that would be appreciated by one of ordinary skill in the art. Accordingly, the user may search for a type of fitting in a database and selects the desired fitting, or select the desired type of fitting from a drop-down menu. In some embodiments, the database may include categories and subcategories of fittings, and the user may browse categories and subcategories until finding the desired component.

In some embodiments, when the user selects a fitting, for example, the user interface 600 displays a symbol corresponding to the fitting, which the user may position on the piping line drawing 620. For example, the user may drag the symbol to a desired position on the piping line drawing 620. In this embodiment shown in FIG. 7, the user has selected symbols for two components, components 705 and 710, and inserted those symbols into the piping line drawing 620. The user may continue to search for additional components present in the point cloud 605, position their corresponding symbols on the piping line drawing 620, and connect the symbols with lines to depict connecting pipes.

Further, the user may connect the symbols 705, 710 with lines corresponding to pipes. For example, the toolbar 204 may provide a button (not shown) for drawing lines. After a user selects this button (also referred to herein as the "line drawing button"), when a user selects a position on the drafting board window 610, the application 150 interprets that position as one end of a line corresponding to a pipe and begins drawing the line from that position. The application 150 interprets the next position selected as the other end of the line, and ends the line accordingly. Then, the user may move the line to other locations on the drafting board window 610. In various embodiments, the user may change the length of a line by, for example, selecting and repositioning one end to extend or shorten the line.

Further, the user may enlarge a section of the piping line drawing 620 to see its components, piping, and associated measurements in more detail. The application 150 may allow the user to select the section in any number of ways. For example, the toolbar 204 may include a zoom icon (not shown). Once the user selects this icon, the user may draw a rectangle around the section of the piping line drawing 620 that he or she wishes to enlarge. In response, the application 150 may depict a magnified version of the contents in the selected rectangle in a window 730, overlaying it over a portion of the piping line drawing 620. In another example, the application 150 may store default dimensions for a window used in such magnification. When a user double clicks a position on the piping line drawing, the application 150 may interpret the selected position as the center of the window whose contents shall be magnified. The application 150 obtains the piping line drawing contents within particular heights and widths from the center. Then the application displays a magnified version of these contents in the window 730.

The application 150 provides various tools to aid creation of the piping line drawing. For example, components in the point cloud may have irregular shapes or be composites of different geometric shapes. To take accurate measurements within the point cloud, a user needs to select positions that are centered within given components. One manner of achieving this objective identifies a three-dimensional geometric shape that best matches a component, overlays the shape over the component depicted in the point cloud, and identifies at least one axis running through the geometric shape's center. In some embodiments, the application 150 may confine the user's selection of positions to those along the axis.

Figure 8:
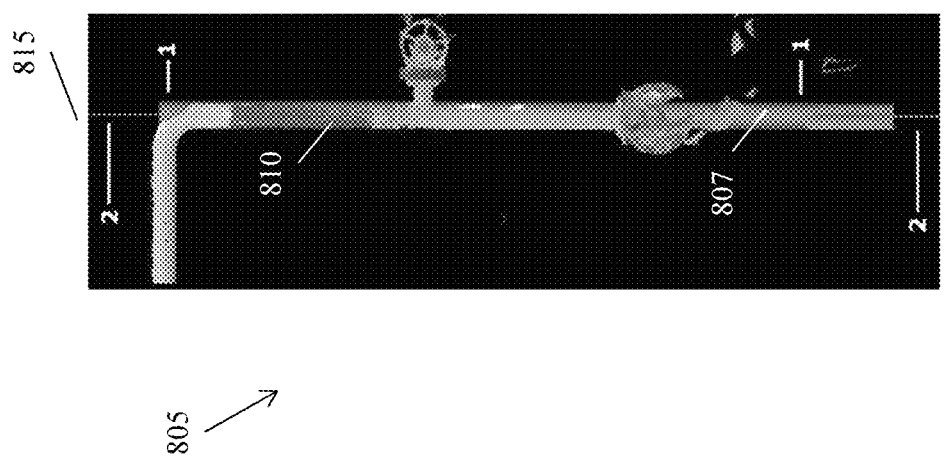
FIG. 8 schematically depicts an exemplary point cloud and an axis fitted to a component therein.

FIG. 8 shows an exemplary point cloud 805 where this geometric overlaying has been applied to a pipe 810. When a user moves a cursor (not shown) around the point cloud 805, the application 150 identifies a pipe 810 located at the cursor's position and determines that a cylinder best matches the geometric shape of the pipe 810. In some embodiments, the application 150 adjusts the cylinder's diameter to fit the pipe's 810. From this cylinder, the application 150 determines an axis 815 that runs through the center of the component 810 and displays the axis 815 on the point cloud 805.

Figure 9:
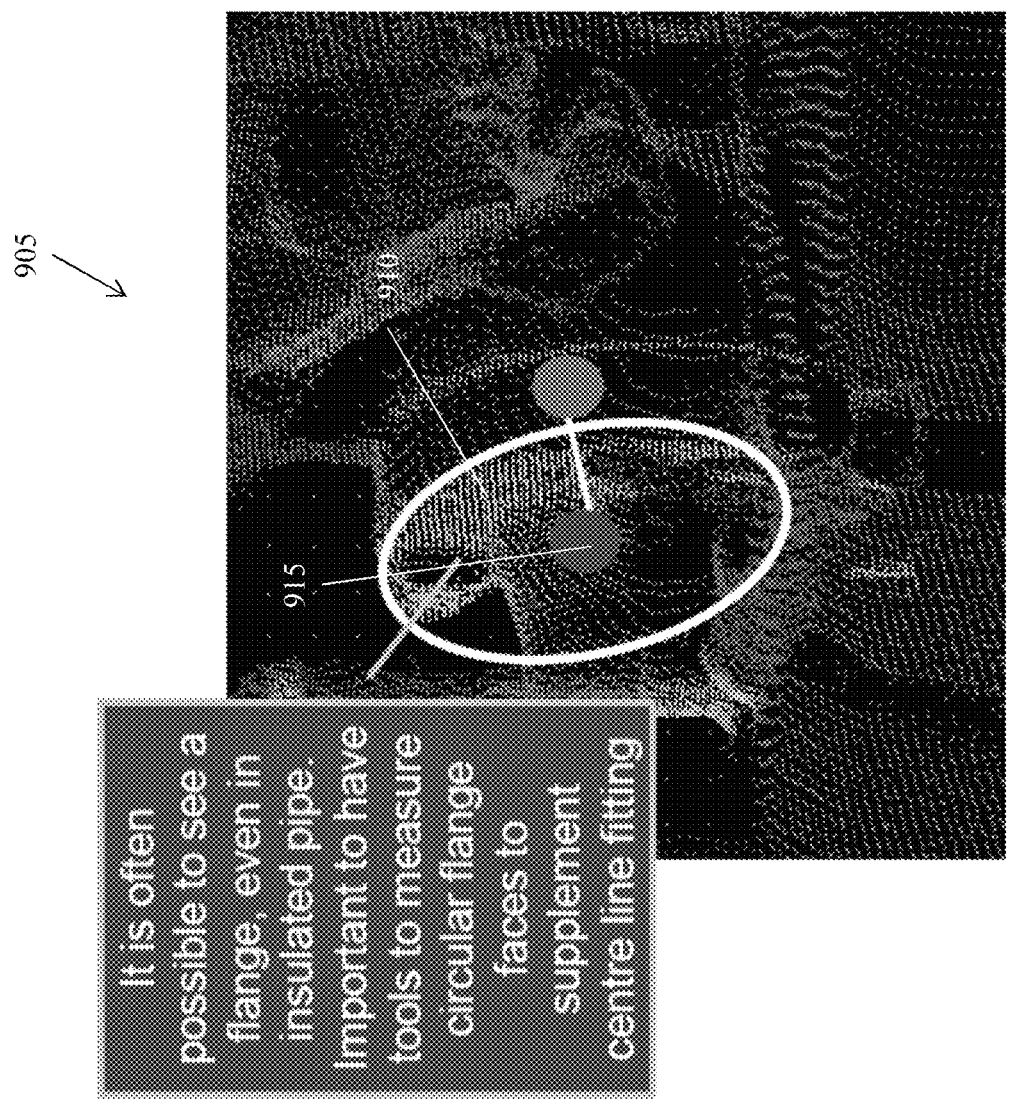
FIG. 9 schematically depicts an exemplary point cloud and a center point fitted to a circular section of a component therein.

Similarly, the application 150 may fit a two-dimensional shape to an end of a fitting to determine its center point, and the application 150 may constrain user selection of the component to this center point. When the user places the cursor proximate to a fitting's end, the application 150 may identify a two-dimensional geometric shape that best matches this surface. The application 150 may overlap the shape on the surface and select a center point. FIG. 9 shows an exemplary point cloud 905 with a flange 910. When the user positions the cursor over the flange 910, the application 150 determines that a circle best matches the end of the flange 910. The application 150 may overlay a circle on the flange 910 and identify its center point 915. In some embodiments, when the cursor is less than a threshold distance from the center point 915, the application 150 displays a dot corresponding to the center point 915. Other embodiments may display a center to a non-circular component (e.g., an ellipse) or a centroid to a component that has no perfect center.

Figure 10:
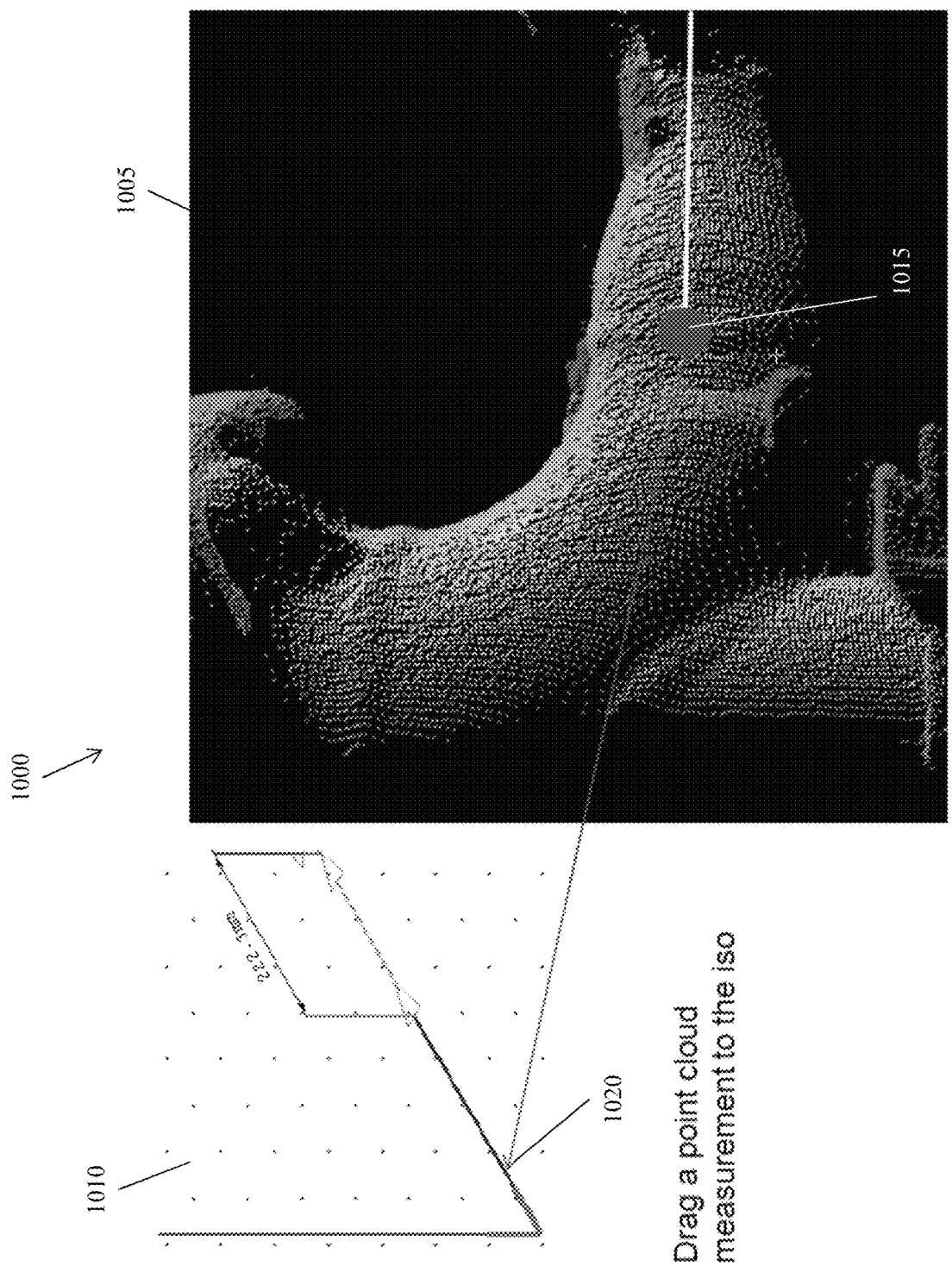
FIG. 10 schematically depicts an exemplary user interface for transferring coordinate data from a point cloud to a piping line drawing.

In various embodiments, a user selects a position on a point cloud, and the point cloud input 160 receives the coordinates of this selected position. Then, the user may select a position on a line drawing to associate with the selected position on the point cloud. The line drawing input 155 receives the coordinates of the selected position. Both the line drawing input 155 and the point cloud input 160 send their received coordinate data to the correlator 165. The correlator may store the coordinates for the point cloud and piping line drawing in association with one another. In some embodiments, when a user creates the association, the application 150 transfers coordinate data from the point cloud to the piping line drawing. FIG. 10 shows an exemplary user interface 1000 for performing this association/transfer. When the user positions a cursor (not shown) within the point cloud 1005, the application 150 displays a dot 1015 corresponding to the cursor's location. The user can select the location on the point cloud 1005 to fix the dot's 1015 location, which also sends the dot's 1015 coordinate data to the point cloud input 160. In some embodiments, the user fixes the dot's 1015 location by left-clicking on the location. The application 150 displays coordinate data corresponding to the dot 1015, as described in more detail below.

The user then selects a location 1020 on the piping line drawing 1010, which sends the location's coordinate data to the line drawing input 155. The user can instruct the application 150 to associate the dot 1015 with the selected location 1020 on the piping line drawing 1010, at which point the correlator 165 stores data (e.g., coordinates) for the selected positions in association with one another. For example, after the user fixes a dot 1015 on the point cloud 1005, the application 150 associates the dot 1015 with the next selected location 1020 on the piping line drawing 1010. In another example, the user selects the dot 1015 and drags it to the location 1020. In some examples, the user selects the displayed coordinate data for the dot 1015 and drags the data to the location 1020. In other examples, the user copies the displayed coordinate data and pastes it proximate to the location 1020. Once the user associates the two locations, the application 150 associates point cloud coordinate data of the dot 1015 with coordinate data for the location 1020 on the piping line drawing 1010. The application 150 may store the associated coordinates.

The user can select two or more positions in the point cloud 1005, and the application 150 may determine the distances between those positions. The user can also select corresponding positions in the piping line drawing. Further, due to association between the selected lengths of the point cloud and piping line drawing, the application 150 can apply the distance between selected positions in the point cloud to a corresponding length of pipe in the piping line drawing 1010. FIGS. 11-13B show exemplary user interfaces that depict a point cloud, selected locations on the point cloud, and information about the selected locations.

Figure 11:
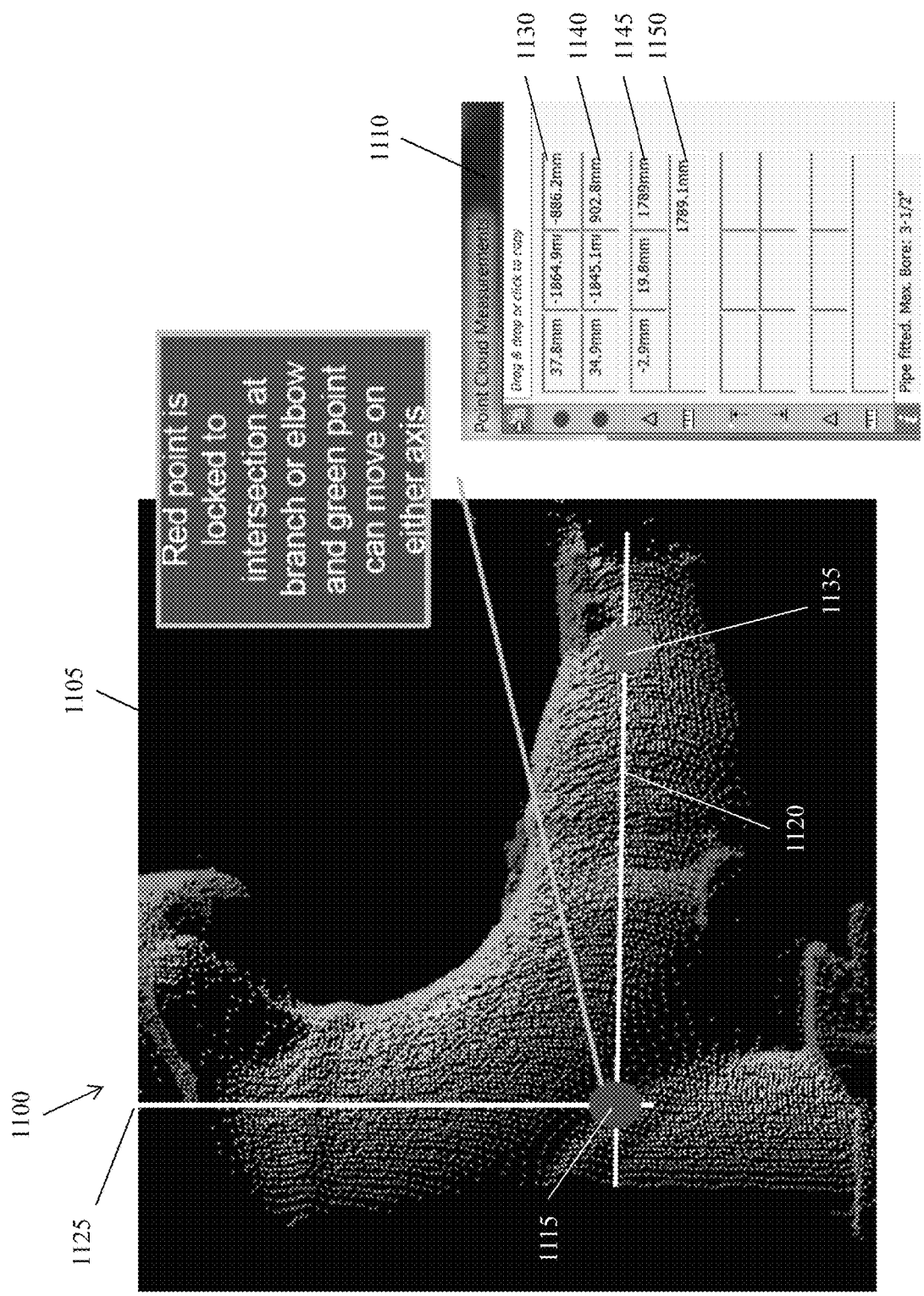
FIGS. 11-13B schematically depict exemplary user interfaces that depicts a point cloud, selected locations on the point cloud, and information about the selected locations.

Specifically, in FIG. 11, the user interface 1100 includes the point cloud 1105 and a point cloud measurement window 1110. When the user selects a location in the point cloud 1105, the application displays coordinate data for the location in the point cloud measurement window 1110.

As noted above with regard to FIG. 10, when the user positions a cursor (not shown) within the point cloud 1105, the application 150 displays a dot 1115 corresponding to the cursor's position. The application 150 identifies a component where the cursor is positioned. In some embodiments, the application determines at least one axis that runs through the center of the component (also referred to herein as a "center line"). In the embodiment depicted in FIG. 11, since the user has positioned the cursor at the intersection of an elbow, the application 150 determines the horizontal and vertical axes 1120, 1125 of the elbow. In some embodiments, when the application 150 determines an axis 1120 or 1125, the application 150 constrains selectable locations on the point cloud 1105 to locations on the axis 1120 or 1125. For example, the application 150 may display a dot 1115 at a position on an axis 1120 or 1125 closest to the location of the cursor.

As the user moves the cursor, the application 150 dynamically displays coordinate data for the pixel corresponding to the cursor in the point cloud measurement window 1110. In this embodiment, the coordinate data includes x-, y-, and z-coordinates for the pixel.

In some embodiments, if the user has not previously selected any locations on the point cloud 1105, the application may display a red dot 1115 (e.g., a first indicator) corresponding to the cursor. Moreover, in response to user selection of a command to select a starting point for a measurement, the application may display the red dot 1115. Once the user selects a location (e.g., left clicks at the location), the application 150 fixes the red dot 1115 on the point cloud 1105. The application 150 displays point cloud coordinate data for the red dot 1115 in fields 1130 in the point cloud measurement window 1110.

After the user fixes the red dot 1115, the application 150 may automatically display a green dot 1135 (e.g., a second indicator) corresponding to the cursor. In other embodiments, the application 150 displays the green dot 1135 in response to user selection of a command to select an ending point for the measurement. In some embodiments, the application constrains selectable locations on the point cloud 1105 to locations on an axis connected to the red dot 1115.

As the user moves the cursor on the point cloud 1105, the application 150 dynamically displays coordinate data 1140 for the green dot 1135 in the point cloud measurement window 1110. The application 150 also dynamically displays distance data regarding the red and green dots 1115, 1135. The point cloud measurement window 1110 displays the differences between the x-, y-, and z-coordinates 1145 of the two dots. Also, the point cloud measurement window 1110 displays the distance 1150 between the two dots.

Figure 12:
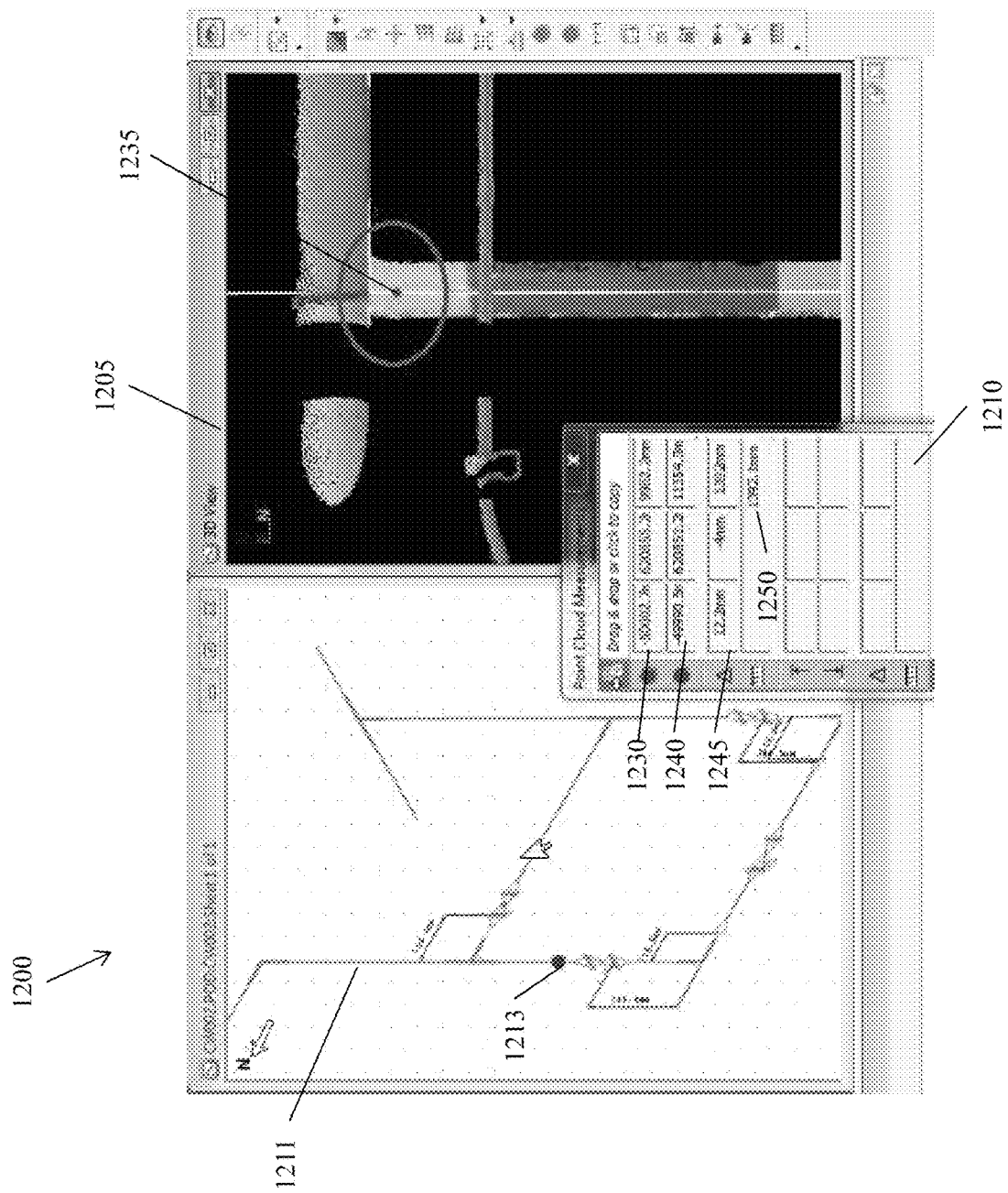

FIG. 12 displays a similar user interface 1200 that includes the point cloud 1205, a point cloud measurement window 1210, and a line drawing 1211. When a user selects a position on the point cloud 1205, the device 100 displays a green dot (e.g., first indicator) on that position. The next time the user selects a position on the piping line drawing 1211, the device 100 displays a corresponding green dot (e.g., first indicator) at that position and associates the indicator with the indicator in the point cloud 1205. Further, when the user selects another position in the point cloud 1205, the device 100 displays a red dot (e.g., second or different indicator), and the next position selected in the piping line drawing 1211 will also be marked with a corresponding red dot (e.g., second or different indicator) and associated with the most recently selected position in the point cloud 1205. In this manner, each time the user selects a position in the point cloud 1205, the device 100 marks that position with a particular indicator, uses a comparable indicator to mark the next selected position in the piping line drawing, and associates with the indicators. The device 100 uses a different indicator (e.g., different color, different shape) for each pair of associated positions in the point cloud 1205 and piping line drawing 1211.

The user interface 1200 maintains the indicators even when the user manipulates either the point cloud 1205 or the piping line drawing 1211 to display different data. In the interface of FIG. 12, the point cloud 1205 currently displays a single indicator (e.g., green dot 1235) while the piping line drawing 1211 displays a single, but different indicator (e.g., red dot 1213). The point cloud 1205 does in fact include a selected position corresponding to the indicator 1213 on the piping line drawing 1211, and vice versa with respect to the indicator 1235. However, the user may have adjusted the point cloud 1205 view to zoom in on a particular component such that the position associated with the piping line drawing's visible indicator 1213 is not visible in the view of the point cloud 1205. Likewise, the user may have adjusted the piping line drawing 1211 so that the position associated with the point cloud indicator 1235 is not visible. Nevertheless, the point cloud measurement window 1210 continues to display the coordinate data 1230 of all selected positions and the distances between corresponding pairs of positions within the point cloud 1205.

In some embodiments, once the user has selected a position on the point cloud 1205, the application 150 constrains the location of the next selected position to the axis of adjacent piping. For example, for the point cloud 1205 depicted herein, selection of the next position is constrained to the vertical axis 1235 of a length of pipe. As the user moves the cursor, the application 150 dynamically displays the coordinate data 1240 associated with the cursor's location along the axis 1235 and distance data 1245, 1250 regarding the last selected position in the point cloud 1205 and the cursor 1235. In this manner, the application 150 may guide measurement of distances between components, lengths of piping, or other metrics by confining the selection of subsequent positions to those along the axes of detected components.

In some situations, components in a point cloud may be composed of multiple geometric shapes such that the components would have multiple axes. In these situations, the application 150 may measure distances from one position to a different position located along one or more axes. For example, in FIG. 13A, a user has selected a location on the point cloud 1305, shown as a red dot 1315. The application 150 also displays the coordinate data 1330 for the red dot 1315 in the point cloud measurement window 1310. The application 150 identifies an elbow at the red dot's 1315 location and determines that an elbow may correspond to two cylinders that are perpendicularly placed, relative to one another. The application may determine a horizontal axis 1320 running through one arm of the elbow and a vertical axis 1325 running through another arm. As the user moves the cursor in the point cloud 1305, the application 150 displays a green dot 1335 along this axis 1320 corresponding to the cursor's location, thus constraining the green dot 1335 to locations along the axis 1320. In the point cloud measurement window 1310, the application 150 dynamically displays the coordinate data 1340 associated with the cursor's location along the axis 1320 and distance data 1345, 1350 regarding the red dot 1315 and the green dot 1335. Although the figure depicts the cursor's location being constrained along the horizontal axis 1320, the location may also be constrained to positions along the vertical axis 1325. In either situation, the application 150 would dynamically update the coordinate data 1340 associated with the cursor's location.

Figure 13A:
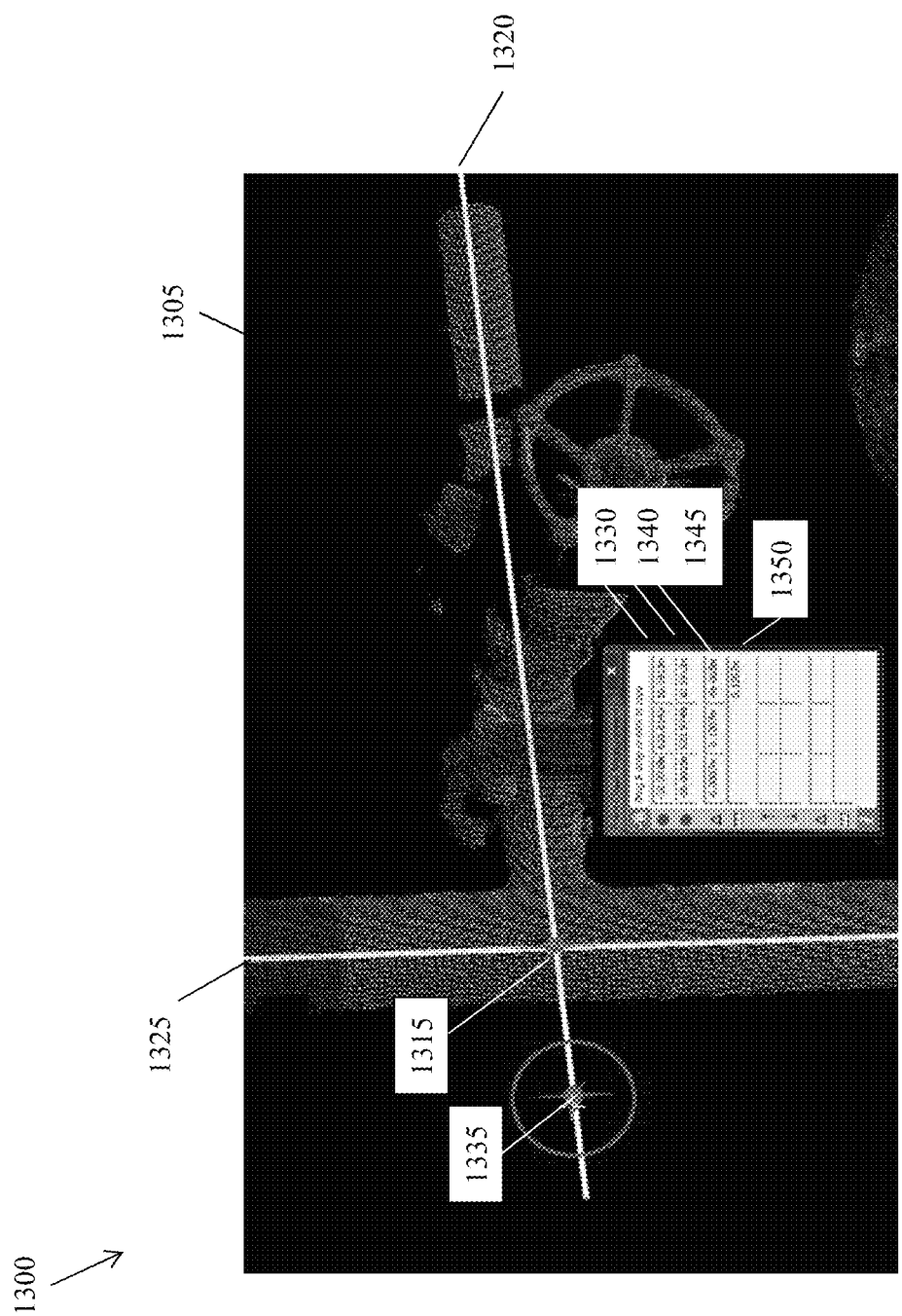
Figure 13B:
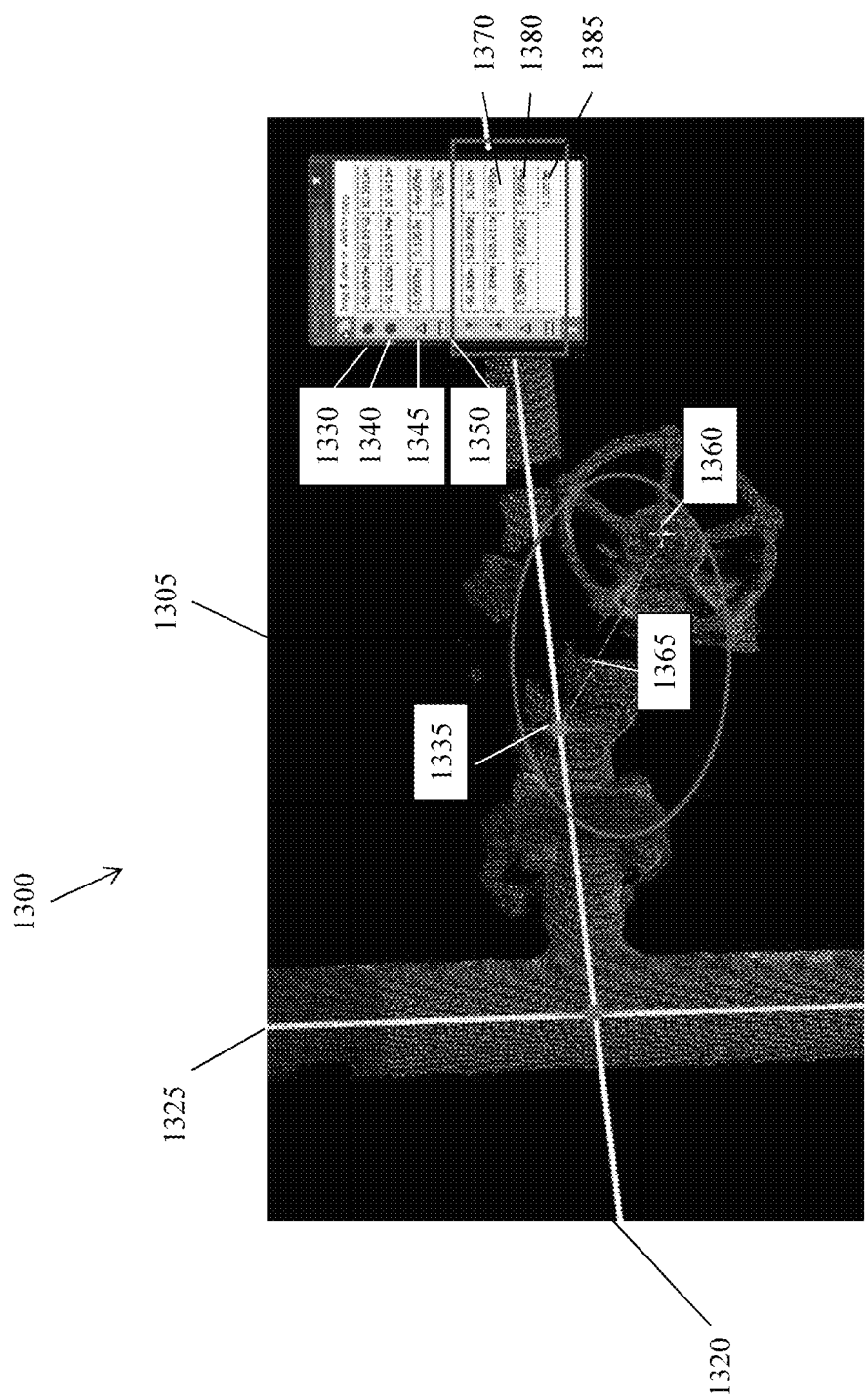

In some situations, the user may wish to take measurements along different axes. In FIG. 13B, a user has selected a command to take a measurement with respect to the center line of a component (e.g., perpendicular to the center line). After the user has selected the command and the center line 1320 to which the command shall be applied, the application 150 displays the cursor 1360, a green dot 1335 on the center line 1320 corresponding to the position on the center line 1320 closest to the cursor 1360, and a line 1365 connecting the cursor 1360 and the green dot 1335. The line 1365 is perpendicular to the center line 1320. When the user moves the cursor 1360, the application 150 determines the location on the center line 1320 closest to the cursor's 1360 new position. The application 150 re-positions the green dot 1335 and line 1365 accordingly.

As the user moves the cursor 1360, the application 150 dynamically displays the coordinate data 1370 associated with the cursor's 1360 location. The application 150 also dynamically displays distance data 1380, 1385 between the cursor 1360 and the green dot 1335. In some embodiments, the user may fix the location of the cursor 1360 and apply the distance between the cursor 1360 and green dot 1335 to the piping line drawing.

Figure 14:
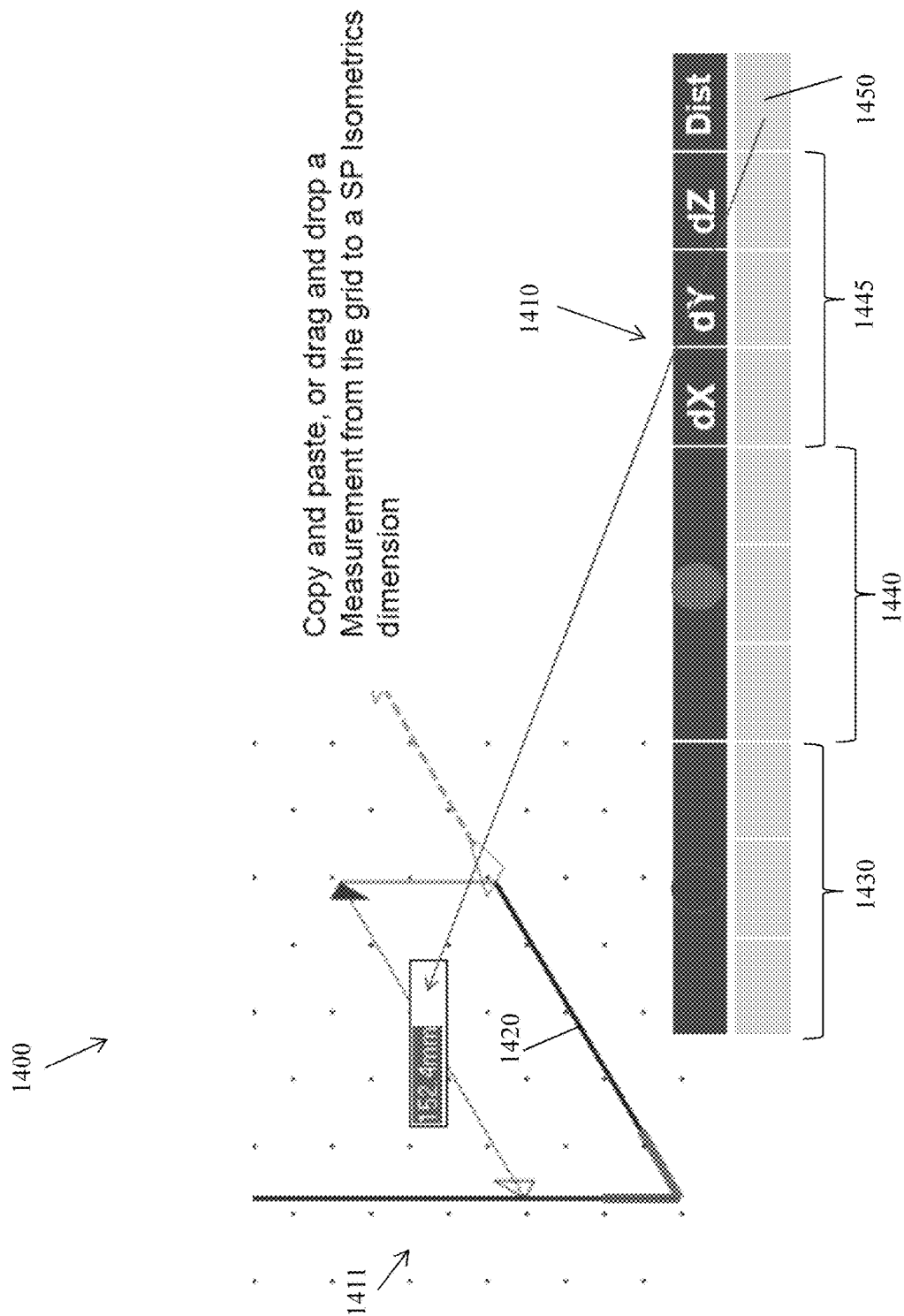
FIGS. 14 and 15 schematically depict exemplary user interfaces for transferring distance data from a point cloud to a piping line drawing.
Figure 15:
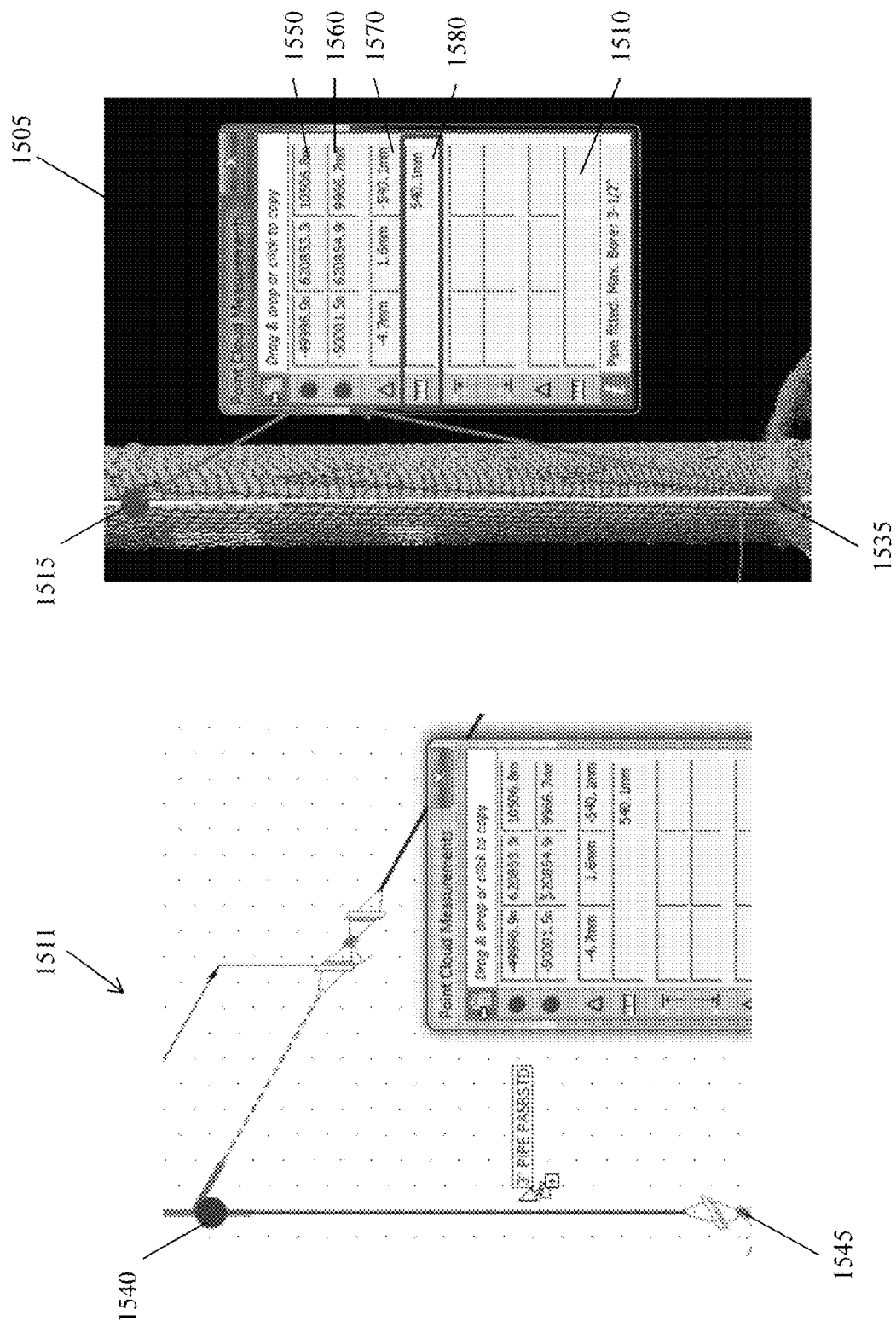

After the user has selected positions in the point cloud and piping line drawing, the user may transfer distance data from the point cloud to corresponding components or lengths of pipe in the line drawing. FIGS. 14 and 15 show exemplary user interfaces for performing such transfers. With respect to FIG. 14, a user interface 1400 includes the piping line drawing 1411 and the point cloud measurement window 1410. The point cloud measurement window 1410 displays coordinate data 1430, 1440 for two locations in the point cloud, differences 1445 between x-, y-, and z-coordinates of the locations, and a distance 1450 between the locations. In this embodiment, the user has associated the red dot with one end of a portion 1420 of a line on the piping line drawing 1411 and the green dot with the other end of the portion 1420.

The user can apply the distance 1450 to the portion 1420 of a line. In some embodiments, the user selects the displayed distance 1450 and drags the distance to the piping line drawing 1411. In other embodiments, the user copies the displayed distance 1450 and pastes it into the piping line drawing 1411. Because the red and green dots have already been associated with locations in the piping line drawing 1411, the application 150 applies the distance between the dots to the component 1420 between the corresponding locations. In some embodiments, the application 150 associates the distance with the two locations on the piping line drawing 1411 and stores this relationship in memory. The application displays the distance proximate to the locations in the piping line drawing 1411.

In FIG. 15, the point cloud measurement window 1510 displays the coordinate data 1550, 1560 and the distance data 1570, 1580 for the red and green dots 1515, 1535. The user applies the distance data to the line segment between positions 1540, 1545 in the piping line drawing 1511, according to any of the methods described herein. In some embodiments, the application 150 displays the distance data proximate to a line segment between the two selected positions 1540, 1545 in the piping line drawing 1511.

In some embodiments, the user selects a command from the toolbar 204 or a menu to overlay a scaled representation of the piping line drawing on the point cloud. The application 150 creates the scaled representation using the lines, fittings, distance data, and any other information from the piping line drawing. When the scaled representation is superimposed on the point cloud, the user is able to view the discrepancies between the piping line drawing and the point cloud.

The user may edit the piping line drawing to match the point cloud more closely. For example, the user may change the length of one or more components. The user may adjust the position of one or more components. The user may add new components. As the user makes changes to the piping line drawing, the application 150 adjusts the scaled representation based on the changes. The user may continue comparing the scaled representation of the piping line drawing with the point cloud and editing the piping line drawing until the piping line drawing corresponds to the point cloud, to the user's satisfaction.

Figure 16:
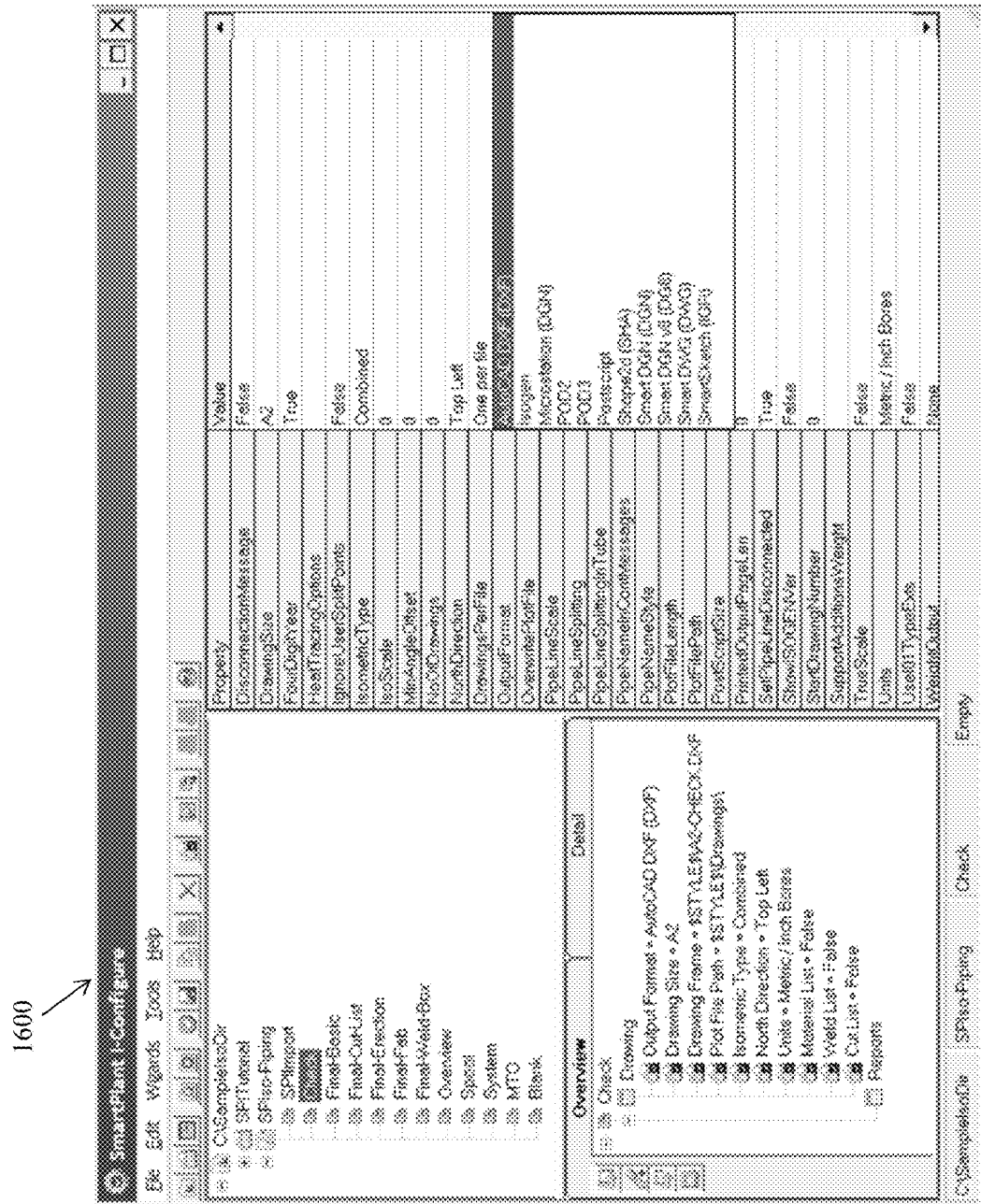
FIG. 16 schematically depicts an exemplary user interface for creating a piping isometric drawing from the piping line drawing to which point cloud distance data has been applied.

FIG. 16 shows an exemplary user interface 1600 for creating a piping isometric drawing from the line drawing to which point cloud distance data has been applied. From this user interface 1600, the user may configure settings regarding the output format of the piping isometric drawing to be produced.

Figure 17:
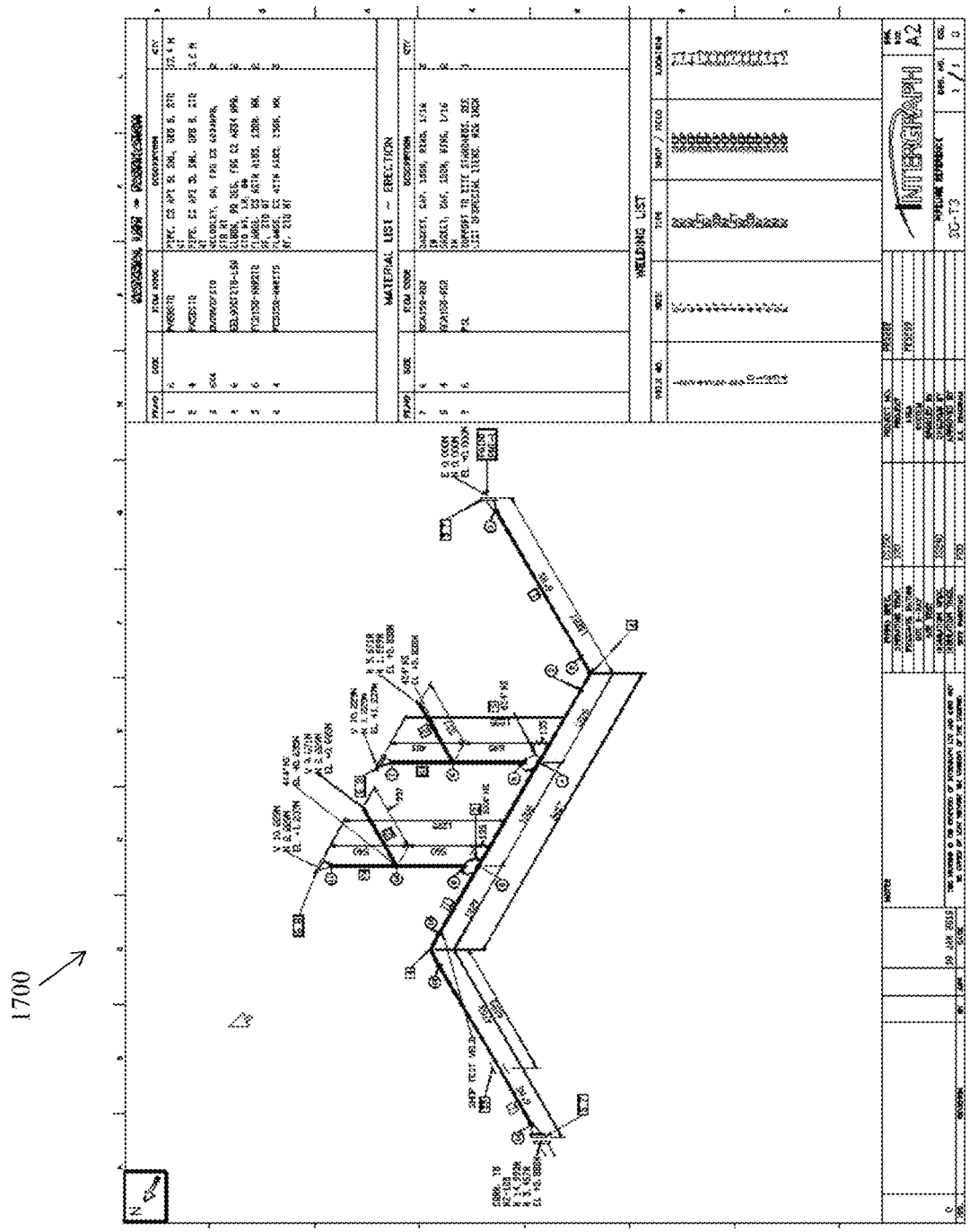
FIG. 17 schematically depicts an exemplary piping isometric drawing created by the application.

FIG. 17 shows an exemplary piping isometric drawing 1700 created by the application is shown and described. When the application 150 converts the piping line drawing, the application 150 may replicate the arrangement of lines corresponding to pipes that are depicted in the line drawing. In some embodiments, the application 150 may remove the graphical symbols for the fittings and substitute industry-accepted symbols or markings. For example, the graphical symbols may have been used during the piping line drawing preparation for simplicity or ease of use. Additionally, during the conversion, the application 150 may populate the piping isometric drawing 1700 with measurements transferred from the point cloud in an industry-accepted format.

In some embodiments, based on the user selection of locations, the application applies the distance data to individual sections of pipe. In other embodiments, based on different user selections, the application applies the distance data to a dimension that spans more than one component (e.g., an individual section of pipe and an elbow).

Illustrative embodiments of the solution presented herein are as follows:

1. An embodiment for associating a point cloud image with a piping line drawing and applying dimensions from the point cloud image to the piping line drawing, the embodiment comprising:

a line drawing input for receiving a piping line drawing representing a three-dimensional object, the piping line drawing having line drawing coordinate data;

a point cloud input for receiving a point cloud of the three-dimensional object, the point cloud having point cloud coordinate data, the point cloud having point cloud distance data of the three-dimensional object; and a correlator operatively coupled with the line drawing input and point cloud input, the correlator being configured to associate the line drawing coordinate data with the point cloud coordinate data, the correlator also being configured to use the associated coordinate data to apply the point cloud distance data to the piping line drawing.

2. The embodiment described in 1, wherein the line drawing input receives inputs from a user corresponding to the piping line drawing, and a display displays the piping line drawing in a user interface.

3. The embodiment described in 2, wherein the display displays the point cloud in the user interface.

4. The embodiment described in 3, wherein the display displays the piping line drawing in a first window of the user interface and displays the point cloud in a second window of the user interface.

5. The embodiment described in 1, wherein the correlator determines a distance between two locations on the point cloud; and applies the distance to a component positioned between two locations on the piping line drawing that correspond to the two locations on the point cloud.

6. The embodiment described in 1, wherein the line drawing input receives a user selection of a first location on the piping line drawing;

the point cloud input receives a user selection of a first location on the point cloud; and the correlator associates coordinate data of the first location on the piping line drawing with coordinate data of the first location on the point cloud.

7. The embodiment described in 6, wherein the point cloud input determines an axis of a component associated with the first location on the point cloud; and constrains user selection of a second location on the point cloud to locations on the axis.

8. The embodiment described in 6, wherein the line drawing input receives a user selection of a second location on the piping line drawing;

the point cloud input receives a user selection of a second location on the point cloud; and the correlator associates coordinate data of the second location on the piping line drawing with coordinate data of the second location on the point cloud.

9. The embodiment described in 8, wherein the correlator determines a distance between the first location and the second location on the point cloud; and applies the distance to a component positioned between the first location and the second location on the piping line drawing.

10. The embodiment described in 9, wherein
the point cloud input receives an update to the second location on the point cloud; and
the correlator updates the distance between the first location and the second location on the point cloud, and applies the updated distance to the component positioned between the first location and the second location on the piping line drawing.

11. The embodiment described in 1, wherein the correlator receives a user input to apply a distance between locations on the point cloud to a length of a component in the piping line drawing.

12. The embodiment described in 1, wherein the point cloud input overlays a scaled representation of the piping line drawing on the point cloud.

13. The embodiment described in 12, wherein the line drawing input receives an input to change a dimension of a component in the piping line drawing; and adjusts the scaled representation of the piping line drawing based on the input.

14. The embodiment described in 1, further comprising a converter that creates a piping isometric drawing from the piping line drawing.

As a result, the solution described herein enables a user to reference a point cloud to quickly and efficiently create up-to-date blueprints for facilities. The user may use a point cloud to create a corresponding piping line drawing, and further create a piping isometric drawing from the line drawing. The application allows the user to easily replicate in a piping line drawing the arrangement of pipes and fittings depicted in a point cloud. Further, by using the position information embedded in a point cloud, a user can accurately and quickly obtain measurements regarding piping and fittings and transfer such measurements to the piping line drawing. The availability of information alleviates the need to take measurements manually in a facility. Further, since the user may obtain measurements from a point cloud, the solution avoids the cumbersome task of manually assessing the exact positions in the facility from which the measurements should be taken. Therefore, the solution described herein improves the accuracy of created blueprints.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

In an alternative embodiment, the disclosed apparatus and methods may be implemented as a computer program product for use with a computer system. Such implementation may include a series of computer instructions fixed either on a tangible medium, such as a computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a tangible removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software. The embodiments of the invention described above are intended to be merely exemplary; numerous variations and modifications will be apparent to those skilled in the art. All such variations and modifications are intended to be within the scope of the present invention as defined in any appended claims.

What is claimed:

1. A computer-based method for creating a piping isometric line drawing, representing a pre-existing facility that includes components and piping, using distance data obtained from a point cloud, of the pre-existing facility, with coordinate data in three dimensions, the method comprising:
displaying, using a display device, the point cloud of the pre-existing facility, each location in the point cloud having coordinate data in three dimensions;
displaying, using the display device, a user interface alongside the point cloud;
forming a 2D piping isometric line drawing in the user interface, based on the point cloud of the pre-existing facility, by
receiving, from one or more users, selections of two locations in two dimensions on the user interface, and
creating a new 2D line in the piping isometric line drawing, corresponding to a pipe displayed in the point cloud, between the two selected locations; and
after creating the new line in the piping isometric line drawing:
transferring distance data, using a processor, from the point cloud to the piping isometric line drawing, the distance data being distance in three dimensions between the two selected locations, by
receiving, from the one or more users, a selection of a location in the point cloud on the user interface corresponding to one end of a pipe and a subsequent selection of a location in the piping isometric line drawing on the user interface corresponding to one end of the formed line;
associating, using a processor, the selected locations in the point cloud and the piping isometric line drawing by associating coordinate data in three dimensions of the selected location on the point cloud with coordinate data in two dimensions of the selected location on the piping isometric line drawing;
receiving, from the one or more users, a further selection of a location in the point cloud on the user interface corresponding to the other end of the pipe and a subsequent further selection of a location in the piping isometric line drawing on the user interface corresponding to the other end of the formed line;
associating, using a processor, the further selected locations in the point cloud and the piping isometric line drawing by associating coordinate data in three dimensions of the further selected location on the point cloud with coordinate data in two dimensions of the further selected location on the piping isometric line drawing;

receiving, from the one or more users on the user interface, an instruction to apply distance data regarding the selected locations in the point cloud to the formed line in the piping isometric line drawing;

defining, using a processor, a distance based on coordinate data in three dimensions for the selected locations on the point cloud; and storing, using a processor, the distance in association with the 2D line on the piping isometric line drawing.

2. The method of claim 1, wherein the new line formed between the two locations on the user interface for the piping isometric line drawing is not to scale with respect to a pipe located between the selected locations on the point cloud.

3. The method of claim 1, wherein
forming the piping isometric line drawing comprises forming the new line in a first window of the user interface; and
displaying the point cloud comprises displaying the point cloud in a second window of the user interface.

4. The method of claim 1, wherein receiving the selection of the location on the point cloud further comprises:
determining an axis of a component associated with the selected location on the point cloud; and
constraining user selection of a further location on the point cloud to locations on the axis.

5. The method of claim 1, further comprising:
receiving an update to the further selected location on the point cloud;
updating the distance between the selected locations on the point cloud; and
applying the updated distance to the new line on the piping isometric line drawing.

6. The method of claim 1, further comprising:
creating a scaled representation of the piping isometric line drawing using at least the distance applied to the piping isometric line drawing; and
overlaying the scaled representation of the piping isometric line drawing on the point cloud.

7. The method of claim 6, further comprising:
receiving, from the one or more users, an instruction to change at least one of the selected locations, or the distance between the selected locations on the piping isometric line drawing; and
adjusting the scaled representation of the piping isometric line drawing based on the input.

8. The method of claim 1, wherein the point cloud further depicts valves.

9. A computer program product including a non-transitory computer-readable medium having computer code thereon, the computer code executable on a computer for creating a piping isometric line drawing, representing a pre-existing facility that includes components and piping, using distance data obtained from a point cloud, of the pre-existing facility, with coordinate data in three dimensions, the computer code comprising:
program code for displaying, on a display device of a computer, the point cloud of the pre-existing facility, each location in the point cloud having coordinate data in three dimensions;
program code for displaying a user interface alongside the point cloud on the display device;
program code for creating a new 2D piping isometric line drawing in the user interface, based on the point cloud of the pre-existing facility, by
receiving, from one or more users, selections of two locations in two dimensions on the user interface, and
forming a 2D line in the piping isometric line drawing, corresponding to a pipe displayed in the point cloud, between the two selected locations; and
program code for transferring, after creation of the new piping isometric line drawing, distance data from the point cloud to the piping isometric line drawing, the distance data being distance in three dimensions between the two selected locations, by
receiving, from the one or more users, a selection on the user interface of a location in the point cloud corresponding to one end of a pipe and a subsequent selection on the user interface of a location in the piping isometric line drawing corresponding to one end of the formed line;
associating the selected locations in the point cloud and the piping isometric line drawing by associating coordinate data in three dimensions of the selected location on the point cloud with coordinate data in two dimensions of the selected location on the piping isometric line drawing;
receiving, from the one or more users, a further selection on the user interface of a location in the point cloud corresponding to the other end of the pipe and a subsequent further selection on the user interface of a location in the piping isometric line drawing corresponding to the other end of the formed line;
associating the further selected locations in the point cloud and the piping isometric line drawing by program code for associating coordinate data in three dimensions of the further selected location on the point cloud with coordinate data in two dimensions of the further selected location on the piping isometric line drawing;
receiving, from the one or more users on the user interface, an instruction to apply distance data regarding the selected locations in the point cloud to the formed line in the piping isometric line drawing;
defining a distance based on coordinate data in three dimensions for the selected locations on the point cloud; and
storing the distance in association with the 2D line on the piping isometric line drawing.

10. The computer program product of claim 9, further comprising:
program code for forming the line in a first window of the user interface; and
program code for displaying the point cloud in a second window of the user interface.

11. The computer program product of claim 9, wherein the program code for receiving the selection of the location on the point cloud further comprises:
program code for determining an axis of a component associated with the selected location on the point cloud; and
program code for constraining user selection of a further location on the point cloud to locations on the axis.

12. The computer program product of claim 9, further comprising:
program code for receiving an update to the further selected location on the point cloud;

program code for updating the distance between the selected locations on the point cloud; and program code for applying the updated distance to the line on the piping isometric line drawing.

13. The computer program product of claim 9, wherein the program code further comprises:

program code for creating a scaled representation of the piping isometric line drawing using at least the distance applied to the piping isometric line drawing; and program code for overlaying the scaled representation of the piping isometric line drawing on the point cloud.

14. The computer program product of claim 13, wherein the program code further comprising:

program code for receiving, from the one or more users, an instruction to change at least one of the selected locations, or the distance between the selected locations on the piping isometric line drawing; and program code for adjusting the scaled representation of the piping isometric line drawing based on the input.

15. A computer apparatus for creating a piping isometric line drawing, representing a pre-existing facility that includes components and piping, using distance data obtained from a point cloud, of the pre-existing facility, with coordinate data in three dimensions, the apparatus comprising:

a display device for:
  (1) displaying the point cloud of the pre-existing facility, each location in the point cloud having coordinate data in three dimensions, and
  (2) displaying a user interface alongside the point cloud;

a line drawing input for:
  (1) receiving, from one or more users, selections of two locations on the user interface, to create a new 2D line on the piping isometric line drawing, the new 2D line corresponding to a pipe displayed in the point cloud, between the two locations, and after creating the new line on the piping isometric line drawing:
  (2) receiving, from the one or more users, selections of locations in two dimensions on the user interface corresponding to ends of the new 2D line in the piping isometric line drawing;

a point cloud input for:
  receiving, from the one or more users, selections on the user interface of locations on the point cloud corresponding to ends of the pipe; and a correlator operatively coupled with the line drawing input and point cloud input, the correlator being configured to:

(1) determine a distance in three dimensions between the selected locations on the point cloud based on coordinate data in three dimensions for the selected locations,
  (2) after creating the new line on the piping isometric line drawing, apply the distance in three dimensions to the new 2D line on the piping isometric line drawing in response to an instruction from the one or more users, and
  (3) associate coordinate data in three dimensions of the selected locations on the point cloud with respective coordinate data in two dimensions of the selected locations on the piping isometric line drawing.

16. The apparatus of claim 15, wherein the display device displays the piping isometric line drawing in a first window of the user interface and displays the point cloud in a second window of the user interface.

17. The apparatus of claim 15, wherein
the correlator associates coordinate data in three dimensions of the selected locations on the point cloud with coordinate data in two dimensions of the locations corresponding to the ends of the new line on the piping isometric line drawing.

18. The apparatus of claim 17, wherein the point cloud input
determines an axis of a component associated with a selected location on the point cloud; and
constrains user selection of a further location on the point cloud to locations on the axis.

19. The apparatus of claim 15, wherein the point cloud input receives an update to one of the selected locations on the point cloud; and
the correlator updates the distance between the selected locations on the point cloud, and applies the updated distance to the new line on the piping isometric line drawing.

20. The apparatus of claim 15, wherein
the line drawing input creates a scaled representation of the piping isometric line drawing using at least the distance applied to the piping isometric line drawing, and
the point cloud input overlays the scaled representation of the piping isometric line drawing on the point cloud.

21. The apparatus of claim 20, wherein the line drawing input receives an input to change at least one of selected locations, or the distance between the selected locations on the piping isometric line drawing; and adjusts the scaled representation of the piping isometric line drawing based on the input.

* * * * *